(12) United States Patent
Maeda

(10) Patent No.: US 6,481,003 B1
(45) Date of Patent: Nov. 12, 2002

(54) ALIGNMENT METHOD AND METHOD FOR PRODUCING DEVICE USING THE ALIGNMENT METHOD

(75) Inventor: Koji Maeda, Sagamihara (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/806,314
(22) PCT Filed: Sep. 30, 1999
(86) PCT No.: PCT/JP99/05394
§ 371 (c)(1),
(2), (4) Date: Mar. 29, 2001
(87) PCT Pub. No.: WO00/19497
PCT Pub. Date: Apr. 6, 2000

(30) Foreign Application Priority Data

Sep. 30, 1998 (JP) .......................................... 10-294479

(51) Int. Cl.$^7$ .............................................. G06F 17/50
(52) U.S. Cl. ........................................... 716/21; 716/19
(58) Field of Search ........................... 716/19–21; 430/5

(56) References Cited

U.S. PATENT DOCUMENTS

| | | | | | |
|---|---|---|---|---|---|
| 5,561,606 | A | * | 10/1996 | Ota et al. ....................... | 716/19 |
| 5,805,866 | A | * | 9/1998 | Magome et al. ............... | 716/19 |
| 5,907,405 | A | * | 5/1999 | Mizutani et al. ............. | 356/399 |
| 6,278,957 | B1 | * | 8/2001 | Yasuda et al. ............... | 702/150 |

FOREIGN PATENT DOCUMENTS

| JP | A 63-140548 | 6/1988 |
|---|---|---|
| JP | A 6-349706 | 12/1994 |

OTHER PUBLICATIONS

U.S. patent application Ser. No. 08/569,400, Yasuda et al., filed Dec. 8, 1995.

* cited by examiner

Primary Examiner—Tuan T. Lam
Assistant Examiner—Long Nguyen
(74) Attorney, Agent, or Firm—Oliff & Berridge, PLC

(57) ABSTRACT

An alignment method for aligning each shot area on a photosensitive substrate with a reticle according to array coordinate predicted by a statistical technique with an improved alignment precision without inviting degradation of throughput, wherein a plurality of alignment marks 29-1, 30-1, 34-1, 35-1 in a short area 27-1 and so forth provided on the n-th wafer 8 ($1 \leq n \leq N-1$) are measured to carry out the alignment of the shot area with the reticle considering the misalignment of the wafer 8 and the distortion of the shot area 27-1 and so forth, and one alignment mark in a shot are 27-1 or another provided on the (n+k)th wafer 8 ($1 \leq k \leq N-n$) is measured to carry out the alignment of the shot area with the reticle considering the misalignment of the wafer 8 found from the measurement results, and the distortion of the shot area 27-1 and so forth obtained when the nth wafer 8 is processed.

28 Claims, 7 Drawing Sheets

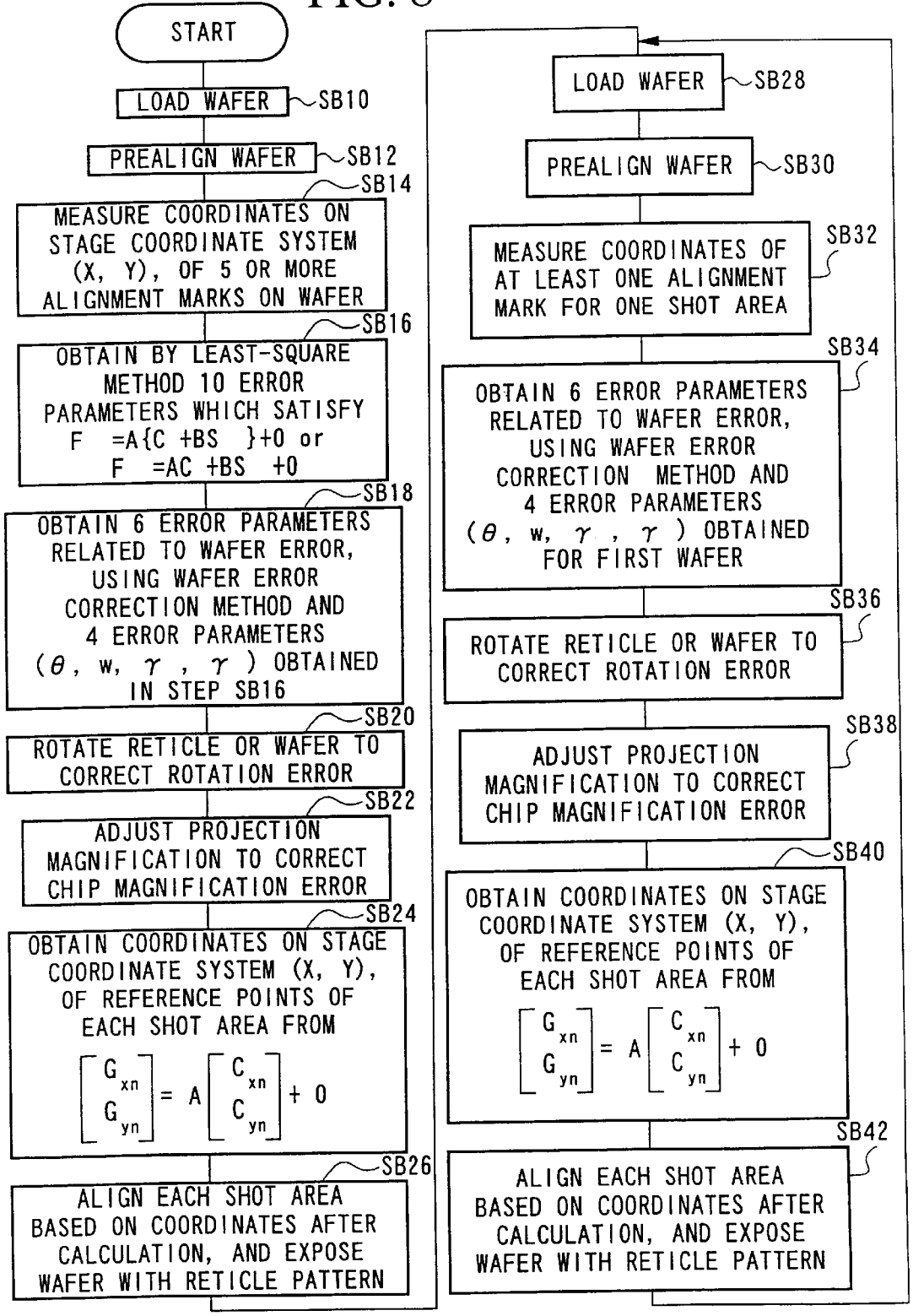

ALIGNMENT METHOD AND METHOD FOR PRODUCING DEVICE USING THE ALIGNMENT METHOD

DESCRIPTION

1. Technical Field

The present invention relates to an alignment method and a method for producing a device using the alignment method, which is suitable for application to the case where, in a projection exposure apparatus which sequentially transfers a pattern image of a reticle onto each shot area on a wafer according to array coordinates predicted for example using a statistical technique, the reticle and each shot area on the wafer are sequentially aligned.

2. Background Art

A projection exposure apparatus by which a pattern image of a photomask or reticle (hereafter generically called "reticle") is projected onto each shot area on an exposure substrate through a projection optical system, is used at the time of manufacturing semiconductor elements or liquid crystal display elements or the like by a photolithography process. In recent years, as this kind of projection exposure apparatus, an exposure apparatus of a so-called step—and—repeat method, for example a reduction projection type exposure apparatus (stepper), is often used, where an exposure substrate is mounted on a stage which is movable in two dimensions, and the exposure substrate is stepped by this stage, and an operation for sequentially exposing the pattern image of the reticle onto each shot area on the exposure substrate is repeated.

For instance, considering a semiconductor element, because circuit patterns of many layers are formed by superposing on a wafer spread with photosensitive material and serving as the exposure substrate, when the circuit patterns of the second and subsequent layers are projection exposed on the wafer, it is necessary to accurately perform alignment of each shot area on the wafer where the circuit pattern has already been formed, with a pattern image of the reticle which is to be exposed thereafter, that is, alignment of the wafer and reticle.

Conventional wafer alignment methods for steppers and the like, are in general as follows (refer for example to Japanese Unexamined Patent Application, First Publication No. 61-44429, and corresponding U.S. Pat. No. 4,780,617).

That is, chip patterns which contain a mark for alignment (alignment mark) are respectively formed on multiple shot areas regularly arranged according to previously set array coordinates on a wafer which becomes the substrate to be processed.

First of all, previously determined alignment marks formed on a prescribed number of shot areas, are detected inside a plurality of shot areas on the wafer, and statistical processing is performed based on this detection result to calculate each position of all the shot areas on the wafer. Then alignment of the wafer is performed based on the calculation result.

In this method, the alignment mark need not be detected for all the shot areas formed on the wafer, and the efficiency of processing is improved.

However, even if the wafer is stepped based on the array coordinates set using this alignment method, satisfactory superpositioning accuracy is not necessarily obtained due to the errors in the wafer error movement mechanism or errors in the reduction ratio of the optical system for projecting the circuit pattern.

Therefore, a method for correcting these errors (hereafter, called wafer errors) has also been contrived (hereunder, this method is called the wafer error correction method). In the wafer error correction method, the measurement result is corrected by operation.

When the wafer error correction method is used, measurement of the alignment mark formed in the shot area, may involve, in the case where the shape of the alignment mark is for example a cross shape, measuring one alignment mark for each shot area (hereafter, called the alignment shot area) where the alignment mark is detected.

Then, the obtained measurement result is corrected by a prescribed operational expression to correct the wafer error, and the position of the shot area where the measurement is not performed is calculated using the measurement result after correction.

Consequently, when this method is used, the error can be corrected without an increase in measurement time, and hence superposition accuracy is improved.

However in this method, only errors of the entire wafer can be corrected, and errors in misregistration or shape of each shot (hereafter, called shot error) cannot be corrected.

Recently, a method for correcting this shot error has also been contrived (hereunder, this method is called the shot error correction method). In the shot error correction method, a plurality of alignment marks formed in the alignment shot area is measured. In the case where this method is used, then for one alignment shot area, when the shape of the alignment mark is for example cross shape, it is necessary to measure at least three points.

In the shot error correction method, at first a plurality of alignment marks is measured, and the obtained measurement result is corrected using a prescribed operational expression (this operational expression is different from the operational expression used in the aforementioned wafer error correction method), and the displacement of the alignment mark from a design value is calculated, and errors in the misregistration and shape for each shot area are corrected based on the calculation result. In this manner, in the shot error correction method, misregistration etc. for each shot area can be measured, and wafer misregistration and the like can be measured.

Therefore, the shot error correction method can perform alignment to a higher accuracy than that for the wafer error correction method.

However, while highly accurate alignment can be performed when, as described above, the shot error correction method is used, it is necessary to measure a plurality of alignment marks for the alignment shot area (at least three points when the alignment mark shape is cross shape). Hence if this measurement is performed for each wafer, a decrease in throughput is incurred.

On the other hand, when the wafer error correction method is used, only one alignment mark in the alignment shot area need be measured, but while throughput is high, alignment accuracy is low.

Recently, further densification of integrated circuits is demanded. For example, for CPUs (central processing units) used in personal computers, ones with a wiring width of 0.35 $\mu$m have been put to practical use, and in the near future plans for a wiring width of 0.25 $\mu$m have been announced. Therefore, it is considered that precise processing technology at even higher densities will be demanded in the future. To answer the demand for such densification, improvement in alignment accuracy becomes extremely important.

Moreover, also in liquid crystal display devices, those which have an even greater number of pixels are required. To answer this demand also, an improvement in alignment accuracy becomes important.

However, there is a problem in that when as mentioned above, the shot error correction method which improves alignment accuracy is used, throughput inevitably decreases.

DISCLOSURE OF INVENTION

The present invention takes into consideration the abovementioned circumstances, with the object of providing an alignment method and a method for producing a device using this method, where, in a method for performing alignment of each shot area on an exposure substrate with a reticle according to array coordinates predicted using a statistical technique, alignment accuracy can be improved without incurring a decrease in throughput.

To solve the abovementioned problems, the present invention, in an alignment method for determining for each of N (N≧2) substrates, exposure position information for a plurality of areas on the substrates to which a pattern of a mask is transferred, involves the steps of:

detecting a plurality of marks on an nth substrate (1≦n≦N−1), and in order to determine exposure position information for a plurality of areas on the nth substrate using a first model function, determining first and second parameters of the first model function using position information of the detected mark, and detecting a plurality of marks on an (n+k)th substrate (1≦k≦N−n), and in order to determine exposure position information for a plurality of areas on the (n+k)th substrate using the first model function, determining the first parameter using a second model function different from the first model function, and position information of a mark detected on the (n+k)th substrate, and using this together with the second parameter determined for the nth substrate.

According to the present invention, alignment accuracy can be improved without incurring a decrease in throughput.

Moreover, the present invention is characterized in that the second model function has a number of parameters less than that of the first model function.

Furthermore, the present invention is characterized in that the second model function contains at least the first parameter.

Moreover, the present invention is characterized in that the first parameter shows array information for the plurality of areas.

Furthermore, the present invention is characterized in that the first parameter contains at least two parameters related to scaling, rotation error, orthogonality or offset of the substrate.

Moreover, the present invention is characterized in that the second parameter shows formation information for an area on the substrate.

Furthermore, the present invention is characterized in that the second parameter contains at least two parameters related to scaling, rotation error or orthogonality of the area.

Moreover, the present invention is characterized in detecting for the nth substrate, a plurality of marks in each of at least three specific areas selected from the plurality of area.

Furthermore, the present invention is characterized in detecting for the (n+k)th substrate, at least one mark for each of at least two specific areas selected from the plurality of areas.

Moreover, the present invention is characterized in detecting for the (n+k)th substrate, a plurality of marks in the specific area, and determining one position information of the specific area from position information of the plurality of marks.

Furthermore, the present invention is characterized in that the total of the marks detected for the (n+k)th substrate is less than the total of the marks detected for the nth substrate.

Moreover, the present invention is characterized in that for the nth substrate, determining of the first and second parameters of the first model function, and determining of the first parameter using the second model function, is performed based on position information of the detected mark, and the first parameter determined by the second model function is used instead of the first parameter determined by the first model function.

Furthermore, the present invention is characterized in that the second model function contains only the first parameter, and a deviation between respective set positions and measured positions in the plurality of specific areas on the substrate where the marks are detected is obtained, and the first parameter is determined so that the sum total of the square of the deviation is a minimum.

Moreover, the present invention is characterized in that the nth substrate is the first substrate, and the (n+k)th substrate is the second substrate.

Furthermore, the present invention is characterized in that the (n+k)th substrate is the third and subsequent substrates, and at the time of determining the exposure position information, at least one of the second parameters respectively determined up to the (n+k−1)th substrate is used.

Moreover, the present invention is characterized in that the nth substrate is at least the first substrate of the N substrates.

Furthermore, the present invention is characterized in that the nth substrate is at least two substrates which are not consecutive from among the N subtrates.

Moreover, the present invention is characterized in that the mask and the substrate are relativity moved based on the determined exposure position information, and a pattern of the mask is respectively transferred to the plurality of areas by a step—and—repeat method or a step—and—scan method.

Furthermore, the present invention is characterized in containing a step where a device pattern is transferred onto a substrate using the above exposure method.

BRIEF DESCRIPTION OF DRAWINGS

FIG. 8 is a flow chart showing a processing sequence in an alignment method according to a second embodiment of the present invention.

BEST MODES FOR CARRYING OUT THE INVENTION

Hereunder is a detailed description of alignment methods according to embodiments of the present invention, with reference to the drawings.

Figure 1:
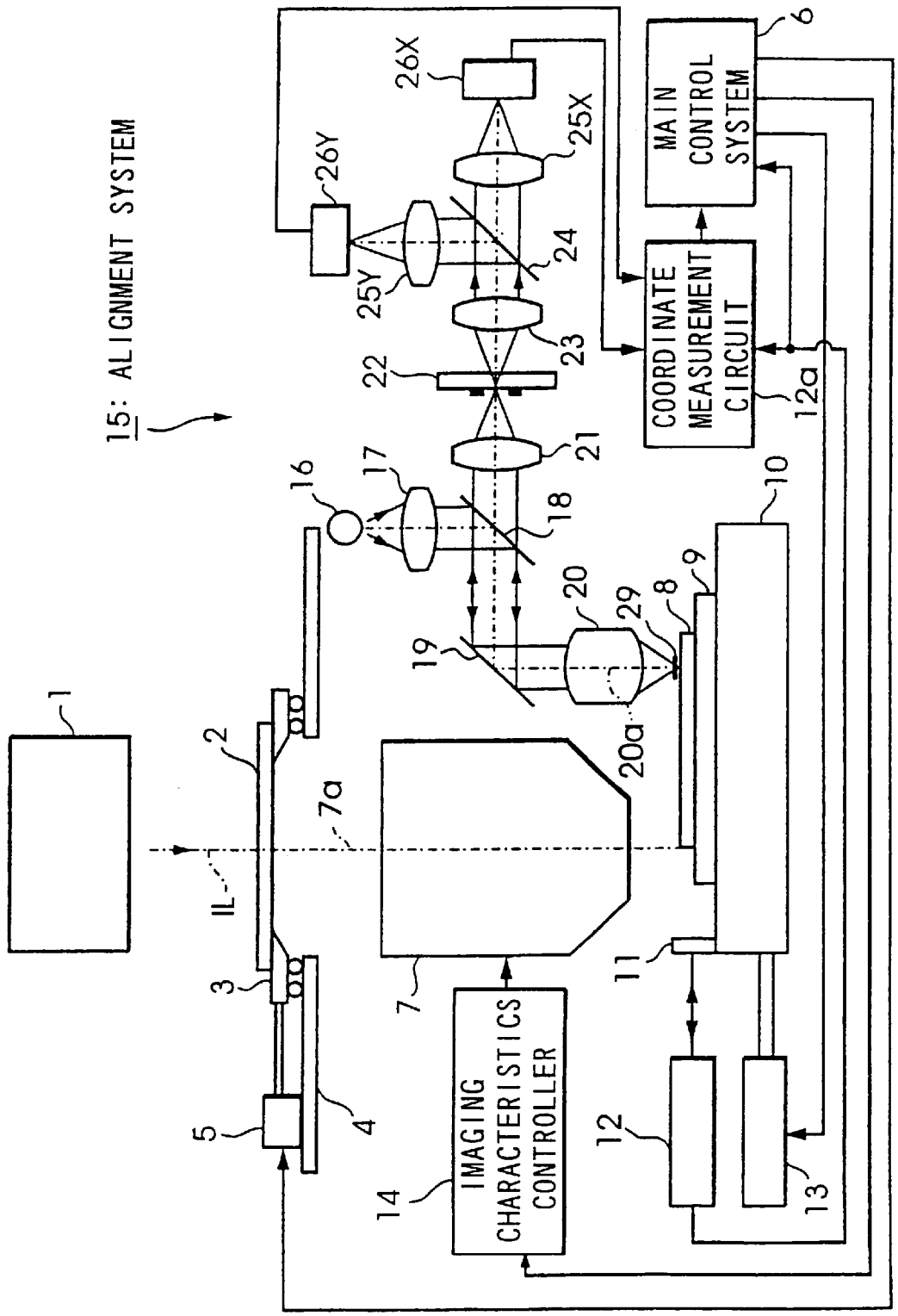
FIG. 1 is a diagram showing the construction of an exposure apparatus to which embodiments of the present invention are applied.

FIG. 1 is a diagram showing the construction of an exposure apparatus to which embodiments of the present invention are applied.

In FIG. 1, exposure light IL emitted from an illumination optical system 1 illuminates a reticle 2 with substantially uniform illuminance. The reticle 2 is held on a reticle stage 3. The reticle stage 3 is supported on a base 4 so as to be able to move in a two dimensional plane and to rotate minutely. A main control system 6 for controlling the operation of the entire apparatus, controls the operation of the reticle stage 3 by means of a drive unit 5 on the base 4.

A pattern image of the reticle 2 is projected to each shot area on a wafer 8 by means of exposure light IL, through a projection optical system 7. The wafer 8 is mounted on a wafer stage 10 by means of a wafer holder 9. The wafer stage 10, as one example, positions the wafer 8 in two dimensions in a plane perpendicular to an optical axis of the projection optical system 7, and comprises; and inclinable X-Y stage, a Z stage for aligning the wafer 8 in a parallel direction (Z direction) to the optical axis of the projection optical system 7, and a stage for minutely rotating the wafer 8.

A movement mirror 11 is fixed on the wafer stage 10, and a laser interferometer 12 is arranged so as to face the movement mirror 11. While only shown in outline in FIG. 1, the rectangular coordinate system in a plane perpendicular to the optical axis of the projection optical system 7 comprises an X-axis and Y-axis, and the movement mirror 11 comprises a plane mirror having a reflection surface perpendicular to the X-axis and a plane mirror having a reflection surface perpendicular to the Y-axis. Moreover, the laser interferometer 12 comprises two X-axis laser interferometers for irradiating laser beams to the movement mirror 11 along the X-axis, and a Y-axis laser interferometer for irradiating a laser beam to the movement mirror 11 along the Y-axis. The X-coordinates and Y-coordinates of the wafer stage 10 are measured by one of the X-axis laser interferometers and the Y-axis laser interferometers. In the following, the coordinate system (X, Y) which consists of the X-coordinates and the Y-coordinates measured in this manner, is called a stage coordinate system or a stationary coordinate system.

Moreover, the rotation angle of the wafer stage 10 is measured by the difference of the measurement values of the two X-axis laser interferometers. Information on the X-coordinates, the Y-coordinates, and the rotation angle measured with the laser interferometer 12, is supplied to a coordinate measurement circuit 12a and the main control system 6. The main control system 6 controls the positioning operation of the wafer stage 10 by a drive unit 13 while monitoring the supplied coordinates. While not shown in FIG. 1, an interferometer system identical to that on the wafer side is also installed on the reticle side.

An imaging characteristics controller 14 is installed in the projection optical system 7 in FIG. 1. The imaging characteristics controller 14 adjusts the projection magnification of the projection optical system 7 and the distortion aberration and the like, by for example, adjusting the spacing of a prescribed lens group in the lens group which constitutes the projection optical system 7, or adjusting the pressure of the gas in the lens chamber between prescribed lens groups. The operation of the imaging characteristics controller 14 is also controlled by the main control system 6.

Moreover, an off-axis alignment system 15 is arranged on the side of the projection optical system 7, and illumination light from a light source 16 is irradiated to the vicinity of an alignment mark 29 on the wafer 8 in this alignment system 15, through a collimator lens 17, a beam splitter 18, a mirror 19, and an object lens 20. In this case, a baseline amount which is the spacing between an optical axis 20a of the object lens 20 and an optical axis 7a of the projection optical system 7, is measured beforehand. Then, the reflection light from the alignment mark 29 is irradiated on the index board 22 through the object lens 20, the mirror 19, the beam splitter 18, and a condensing lens 21, and the image of the alignment mark 29 is thus imaged on the index board 22.

The light which passes through the index board 22 is directed towards a beam splitter 24 via a first relay lens 23, while the light which passes through the beam splitter 24 is focussed by means of an X-axis second relay lens 25X onto the imaging surface of an X-axis imaging element 26X consisting of a two-dimensional CCD camera, and the light reflected by the beam splitter 24 is focused by means of a Y-axis second relay lens 25Y onto the imaging surface of a Y-axis imaging element 26Y consisting of a two-dimensional CCD camera. The image of the alignment mark 29 and the image of the index mark on the index board 22 are superimposed on the imaging surfaces of the imaging elements 26X and 26Y. The imaging signals of the imaging elements 26X and 26Y are both supplied to the coordinate measurement circuit 12a.

Figure 2:
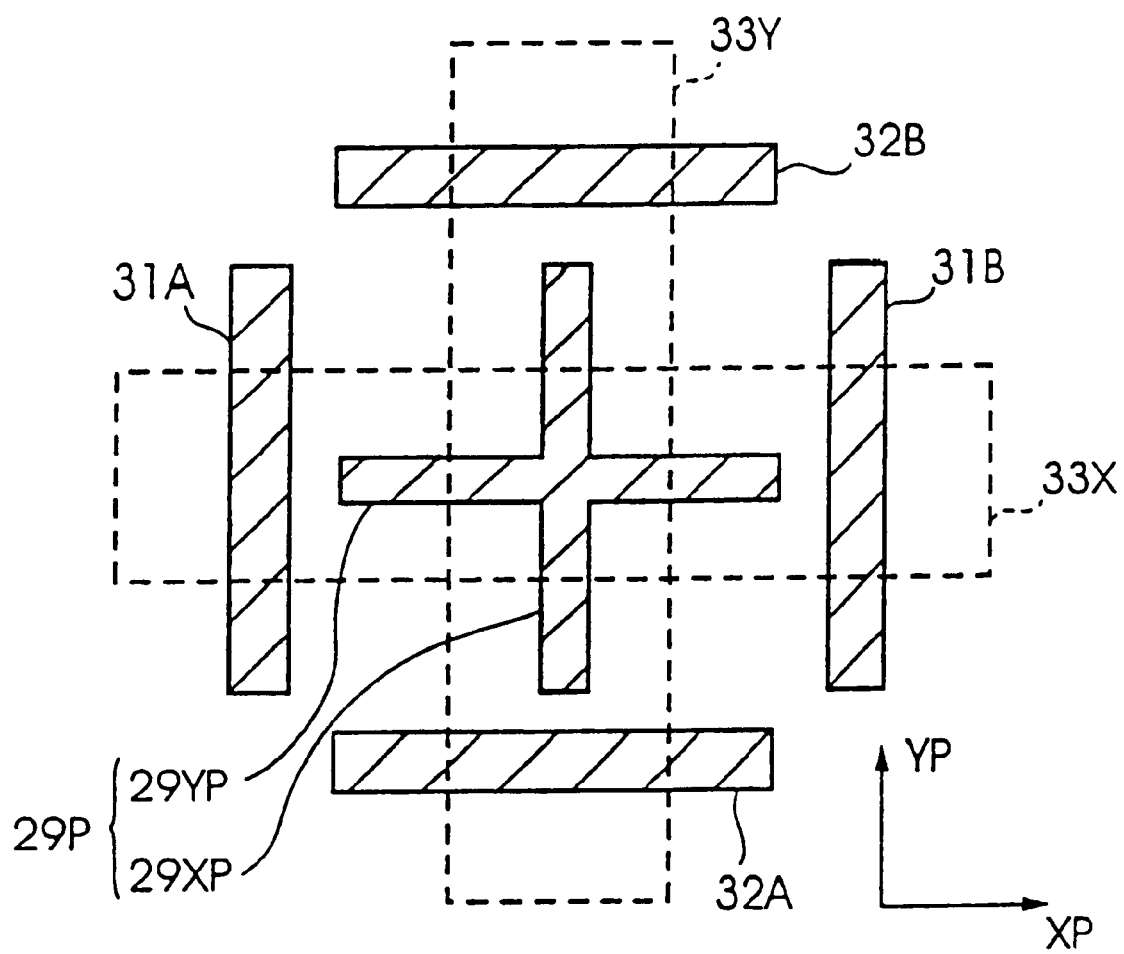
FIG. 2 is a diagram showing the pattern on an index board 22 of FIG. 1.

FIG. 2 is a diagram showing the pattern on the index board 22 of FIG. 1.

In FIG. 2, an image 29P of a cross shaped alignment mark 29 is imaged on a center part, and an XP direction and YP direction respectively perpendicular to orthogonal straight line pattern images 29XP and 29YP of this image 29P are each conjugate with the X direction and Y direction of the stage coordinate system of the wafer stage 10 in FIG. 1. Then, two index marks 31A and 31B are formed so as to place the alignment mark image 29P therebetween in the XP direction, and two index marks 32A and 32B are formed so as to place the alignment mark image 29P therebetween in the YP direction.

In this case, images in a detection area 33X enclosing the index marks 31A, 31B and the straight line pattern image 29XP in the XP direction, are imaged with the X-axis imaging element 26X of FIG. 1, and images in a detection area 33Y enclosing the index mark 32A, 32B and the straight line pattern image 29YP in the YP direction, are imaged with the Y-axis imaging element 26Y of FIG. 1.

In addition, the scanning directions when reading the photoelectric conversion signal from each pixel of the imaging elements 26X and 26Y, are set in the XP direction and the YP direction respectively, and the amount of misregistration in the XP direction and the YP direction of the alignment mark image 29P and the index marks 31A, 31B and 32A, 32B can be obtained by processing the imaging signal of the imaging elements 26X and 26Y.

Therefore, in FIG. 1 the coordinate measurement circuit 12a obtains coordinates on the stage coordinate system (X, Y) of the alignment mark 29, from the positional relation of the image of the alignment mark 29 on the wafer 8 and the index mark on the index board 22, and the measurement result of the laser interferometer 12 at that time, and supplies the coordinate values measured in this manner to the main control system 6.

Next, is a description of the operation in this embodiment, when each slot area on the wafer 8 is aligned with the pattern image of the reticle 2, and exposure to each shot area is performed.

In this embodiment, because the aforementioned wafer error measurement method and the shot error correction method are used, at first these correction methods are explained in detail.

[Wafer error correction method]

Figure 3A:
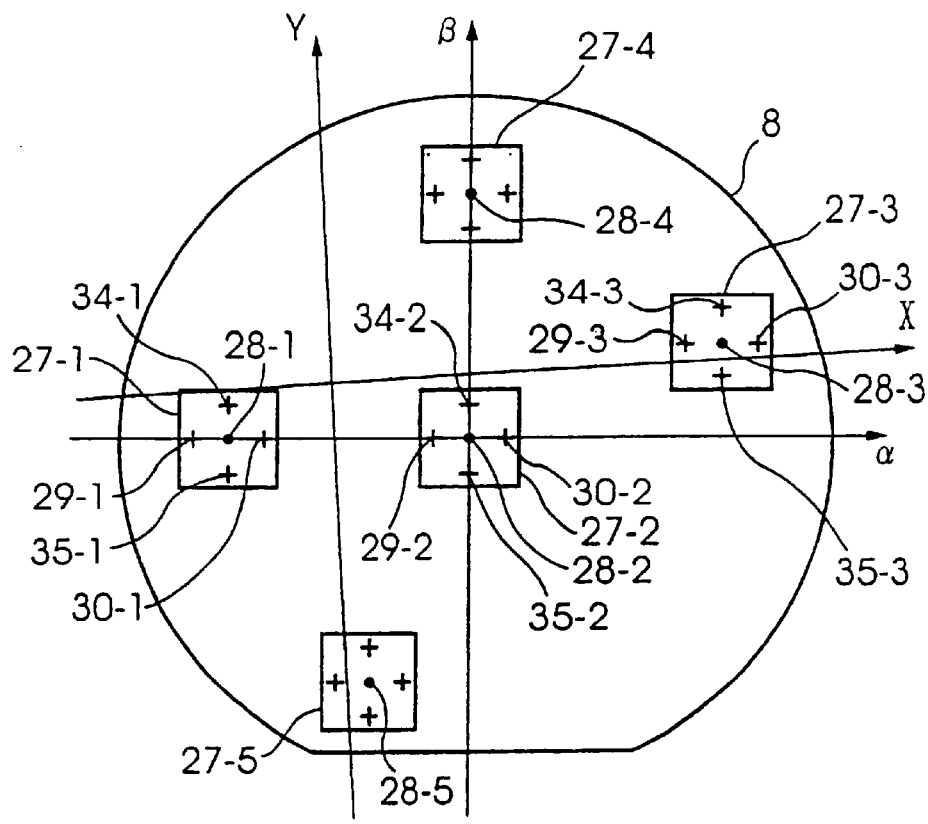
FIGS. 3A and 3B are diagrams for explaining wafer error and a correction method thereof.
Figure 3B:
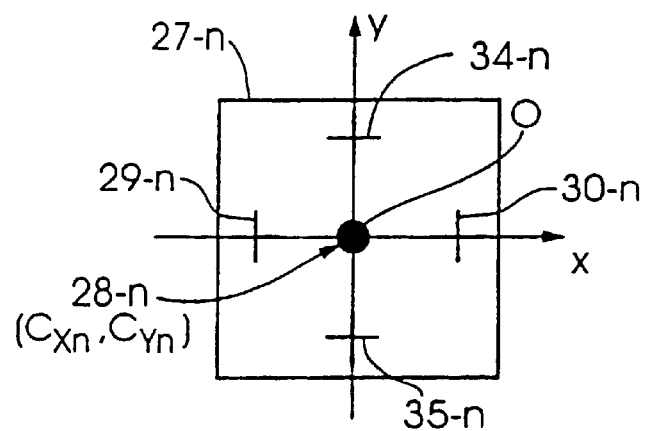

FIGS. 3A and 3B are diagrams for explaining wafer error and the correction method therefor.

FIG. 3A shows the wafer 8 in FIG. 1. In this FIG. 3A, a plurality of shot areas 27-n (n=0, 1, 2, . . . ) is arranged in matrix form along an orthogonal coordinate system ($\alpha$, $\beta$) on the wafer 8, and respective chip patterns are formed in each shot area 27-n by the exposure and development etc. in a former step. In FIG. 3, only five shots areas 27-1 to 27-5 of a plurality of shot areas are representatively shown.

Respective reference positions are determined for each shot area 27-n. For example, if a reference position is assumed to be reference point 28-n at the center of each shot area 27-n, the design coordinate values in the coordinate system ($\alpha$, $\beta$) on the wafer 8 for this reference point 28-n, are respectively shown by ($C_{Xn}$, $C_{Yn}$). Moreover, four alignment marks 29-n, 30-n, 34-n and 35-n are provided accompanying each shot area 27-n.

In the wafer error correction method, at least one alignment mark of the alignment marks for alignment formed in the shot area 27-n is measured, and the reference point 28-n in the shot area thereof is calculated from this measurement result.

In this case, if a coordinate system (x, y) on the shot area as shown in FIG. 3B is set for each shot area 27-n in parallel with the coordinate system ($\alpha$, $\beta$) on the wafer of FIG. 3A, design coordinates in the coordinate system (x, y) for the alignment marks 29-n, 30-n, 34-n, and 35-n are respectively shown as ($S_{1Xn}$, $S_{1Yn}$), ($S_{2Xn}$, $S_{2Yn}$), ($S_{3Xn}$, $S_{3Yn}$), and ($S_{4Xn}$, $S_{4Yn}$).

Returning to FIG. 3A, the wafer 8 is mounted on the wafer stage 10 of FIG. 1, and sequential superpositioning and exposure of the projection image of the reticle is performed by the step—and—repeat method, for each of the plurality of shot areas where the chip pattern has already been formed.

At this time, the correspondence relation of the stage coordinate system (X, Y) which prescribes the movement position of the wafer stage 10, and the wafer coordinate system ($\alpha$, $\beta$), is not necessarily limited to being the same as the relation in the former step.

Hence, even if coordinates in the stage coordinate system (X, Y) are obtained from design coordinate values ($C_{Xn}$, $C_{Yn}$) of the reference point 28-n for each shot area 27-n related to the coordinate system ($\alpha$, $\beta$), and the wafer is moved based on these coordinates, it happens sometimes that each shot region 27-n is not precisely aligned.

Therefore, firstly, as with the conventional example, alignment error arises from the following four factors.

(1) Rotation of the wafer.

This is shown by the residual rotation error $\theta$ of the coordinate system ($\alpha$, $\beta$) of the wafer with respect to the stage coordinate system (X, Y).

(2) Orthogonality of the stage coordinate system (X, Y):

This is caused by the feed of the wafer stage 10 in the X direction and the Y direction being not accurately orthogonal, and is shown by the orthogonality error W.

(3) Linear expansion and contraction of the wafer (wafer scaling) in the $\alpha$ direction and the $\beta$ direction in the coordinate system ($\alpha$, $\beta$):

This is where the wafer 8 expands and contracts overall due to the manufacturing process etc. This amount of expansion and contraction is shown respectively by wafer scaling $R_x$ and $R_y$ for the $\alpha$ direction and the $\beta$ direction. Here, wafer scaling $R_x$ for the $\alpha$ direction is shown by the ratio of the actual measurement value of the distance between two points in the $\alpha$ direction on the wafer 8, and the design value, and wafer scaling $R_y$ for the $\beta$ direction is shown by the ratio of the actual measurement value between two points in the $\beta$ direction, and the design value.

(4) Offset of the coordinate system ($\alpha$, $\beta$) on the wafer with respect to the stage coordinate system (X, Y):

This is caused by the wafer 8 being displaced overall by only a minute amount with respect to the wafer stage 10, and is shown by offset amount $O_x$, $O_y$.

When the aforementioned (1)–(4) error factors are combined, then for where the design coordinate values of the reference point 28-n are for the shot area of ($C_{Xn}$, $C_{Yn}$), the coordinates ($C'_{Xn}$, $C'_{Yn}$) on the stage coordinate system (X, Y) to be positioned for actual exposure, are shown by the following equation (1).

$$\begin{bmatrix} C'_{Xn} \\ C'_{Yn} \end{bmatrix} = \begin{bmatrix} R_x & 0 \\ 0 & R_y \end{bmatrix} \begin{bmatrix} \cos\Theta & -\sin\Theta \\ \sin\Theta & \cos\Theta \end{bmatrix} \begin{bmatrix} 1 & -\tan W \\ 0 & 0 \end{bmatrix} \begin{bmatrix} C_{Xn} \\ C_{Yn} \end{bmatrix} + \begin{bmatrix} O_X \\ O_Y \end{bmatrix} \quad (1)$$

Here, assuming that the orthogonality error W and the residual rotation error $\theta$ are minute amounts, when a first approximation is made, equation (1) becomes the following equation (2).

$$\begin{bmatrix} C'_{Xn} \\ C'_{Yn} \end{bmatrix} = \begin{bmatrix} R_x & -R_x \cdot (W + \Theta) \\ R_y \cdot \Theta & R_y \end{bmatrix} \begin{bmatrix} C_{Xn} \\ C_{Yn} \end{bmatrix} + \begin{bmatrix} O_X \\ O_Y \end{bmatrix} \quad (2)$$

Calculating the error parameters ($\theta$, W, $R_x$, $R_y$, $O_X$, $O_Y$) using the expression shown in equation (2), and correcting the error, is the aforementioned wafer error correction method.

When the array coordinates of the shot area 27-n on the wafer 8 are calculated, the value of the six error parameters ($\theta$, W, $R_x$, $R_y$, $O_X$, $O_Y$) of equation (2) need not be obtained individually, and only each element (parameter) of equation (2), that is each value of $R_x$, $-R_x \cdot (W+\theta)$, $R_y \cdot \theta$, $R_y$, $O_x$, and $O_y$ need be obtained.

To here has been explained the accurate alignment of a reference position on each shot area 27-n (in this example, the reference point 28-n at the center of each shot area).

In this method, as mentioned above, only one alignment mark of the alignment marks for the alignment formed in each shot area need be measured. Therefore, the time required for the measurement is short.

When the array coordinates of each shot area on the water are calculated using the aforementioned equation (2), at least three shot areas on the wafer are selected as alignment shot areas, and at least one alignment mark for each alignment shot area is detected, and two position information (coordinate values for the X direction and the Y direction) are obtained. In this example, because the alignment marks are two dimensional marks, two position information can be obtained by only detecting one alignment mark. Hence shortening of the required time for alignment (calculation of the array coordinates), that is an improvement in throughput can be achieved. Of course, even when the aforementioned equation (2) is used, a plurality of alignment marks for each alignment shot area may be detected. At this time, if for each alignment shot area, a plurality of position information is respectively obtained for the X direction and the Y direction, then for instance by an averaging treatment or the like, one position information may be determined from the plurality of position information for each direction (coordinates axis).

However, if the reference points of each shot area are accurately aligned, the entire chip pattern in each shot area and the projection image of the reticle need not necessarily be accurately superposed all over.

Next is a description of the shot error correction method for correcting the shot error in each shot area.

[Shot error correction method]

As already explained, in FIG. 3B, the respective alignment marks 29-n, 30-n, 34-n, and 35-n are formed at positions where the design coordinate values in the coordinate system (x, y) on an arbitrary shot area 27-n are ($S_{1Xn}$, $S_{1Yn}$) to ($S_{4Xn}$, $S_{4Yn}$). Superposition errors in each of these shot areas is caused by the following factors.

(5) Rotation of the chip pattern (chip rotation):

This is caused for instance when the reticle 2 rotates with respect to the stage coordinate system (X, Y), or yawing is mixed with the movement of the wafer stage 10, when the projection image of the reticle 2 is exposed on the wafer 8, and is shown by the rotation error θ with respect to the coordinate system (x, y) of the shot area.

(6) Chip orthogonality error:

This is orthogonality error of the chip caused for instance, by distortion of the pattern itself on the reticle 2, or distortion (distortion aberration) or the like of the projection optical system 7, when the projection image of the reticle 2 is exposed on the wafer 8, and is shown by angular error w.

(7) Linear expansion and contraction of the chip (chip scaling):

This is caused for example by error of the projection magnification when the projection image of the reticle 2 is exposed on the wafer 8, or by the wafer 8 overall or partially expanding and contracting due to the manufacturing process of the wafer 8. Here, this shows linear expansion and contraction into two directions, with a chip scaling $r_x$ in the x direction which is the ratio of the actual measurement value of the distance between two points in the x direction of coordinate system (x, y) in the shot area, and the design value, and a chip scaling $r_y$ in the y direction which is the ratio of the actual measurement value of the distance between two points in the y direction, and the design value.

Figure 4A:
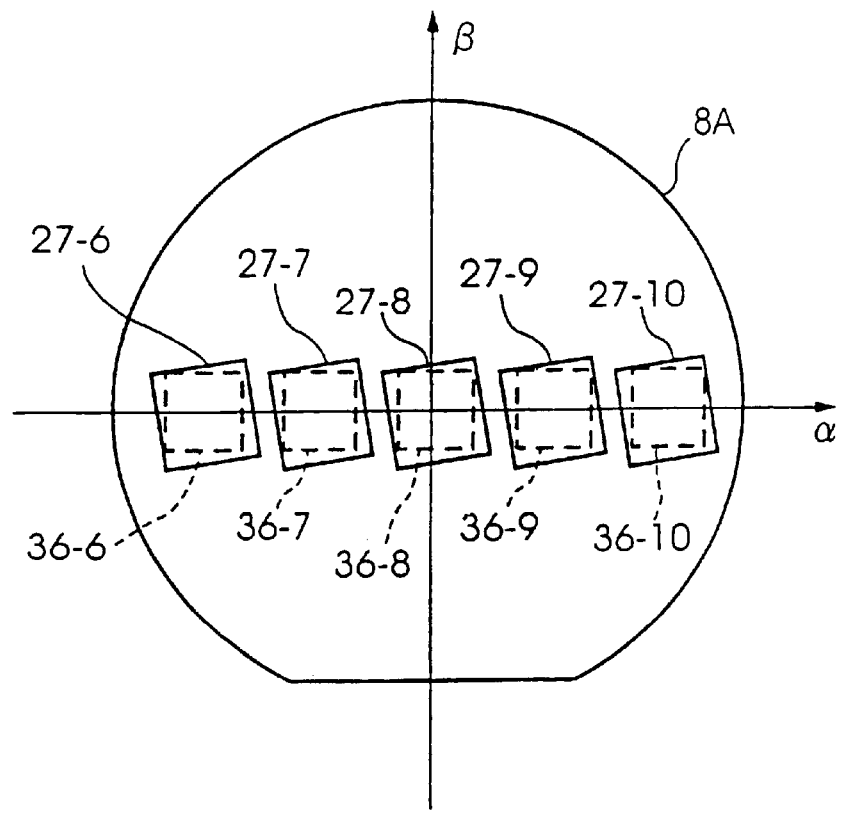
FIGS. 4A to 4C are diagrams for explaining shot error and a correction method thereof.
Figure 4B:
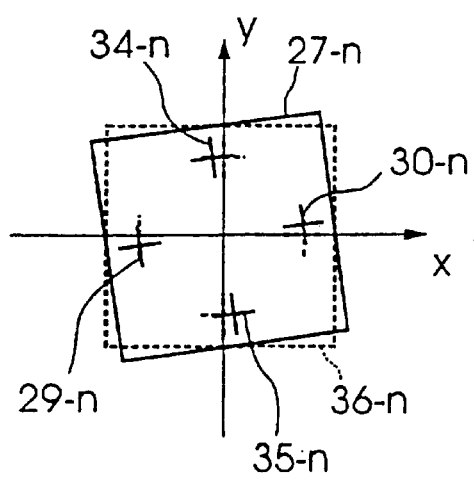
Figure 4C:
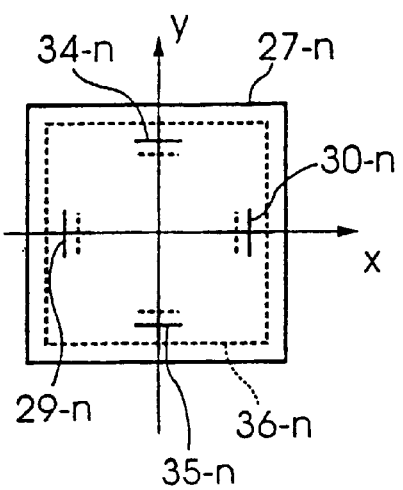

FIGS. 4A to 4C are figures for explaining the shot error and the correction method therefor.

FIG. 4A shows a wafer 8A in which rotation error and magnification error occur in the chip pattern of each shot area 27-n formed by the former step. In this FIG. 4A, an example of a shot area where there is neither a rotation error nor a magnification error is shown by the shot areas 36-6 to 36-10 enclosed by the dashed line.

On the other hand, regarding the shot areas 27-6 to 27-10 actually formed on the wafer 8A, the rotation angle and the magnification are different.

These errors can be separated into the chip rotation error where as shown in FIG. 4B, the shot area 27-n is inclined to the original shot area 36-n, and the chip scaling error where as shown in FIG. 4C the magnification of the shot area 27-n is different from the magnification of original shot area 36-n.

However, in the example of FIGS. 4A to 4C, the case is shown where there is no orthogonality error w of the chip pattern, and where the chip scaling $r_x$ in the x direction and the chip scaling $r_y$ in the y direction are equal. When the aforementioned (5) to (7) error factors are combined, then for where the design coordinate values on the shot area 27-n are for the alignment marks 29-n, 30-n, 34-n, and 35-n of ($S_{NXn}$, $S_{NYn}$) (N=1 to 4), the coordinate values (S'$_{NXn}$, S'$_{NYn}$) on the coordinate system (x, y) of the shot area to be actually aligned are shown as follows.

$$\begin{bmatrix} S'_{NXn} \\ S'_{NYn} \end{bmatrix} = \begin{bmatrix} r_x & 0 \\ 0 & r_y \end{bmatrix} \begin{bmatrix} \cos\theta & -\sin\theta \\ \sin\theta & \cos\theta \end{bmatrix} \begin{bmatrix} 1 & -\tan w \\ 0 & 0 \end{bmatrix} \begin{bmatrix} S_{NXn} \\ S_{NYn} \end{bmatrix} \quad (3)$$

Here, assuming that the orthogonality error w and the rotation error θ are minute amounts, when a first approximation is made, equation (3) is shown by the following equation (4).

$$\begin{bmatrix} S'_{NXn} \\ S'_{NYn} \end{bmatrix} = \begin{bmatrix} r_x & -r_x \cdot (w+\theta) \\ r_y \cdot \theta & r_y \end{bmatrix} \begin{bmatrix} S_{NXn} \\ S_{XYn} \end{bmatrix} \quad (4)$$

In FIG. 3B, because the array coordinate values on the stage coordinate system (X, Y) of the reference point 28-n of the arbitrary shot area 27-n are ($C_{Xn}$, $C_{Yn}$), the design coordinate values ($D_{NXn}$, $D_{NYn}$) in the stage coordinate system (X, Y) of an arbitrary alignment mark (29-n to 30-n) on the arbitrary shot area, are shown in the following equation (5). Here, classification of the alignment marks 29-n to 35-n is performed for N values (1 to 4) as mentioned above.

$$\begin{bmatrix} D_{NXn} \\ D_{XYn} \end{bmatrix} = \begin{bmatrix} C_{Xn} \\ C_{Yn} \end{bmatrix} + \begin{bmatrix} S_{NXn} \\ S_{XYn} \end{bmatrix} \quad (5)$$

The abovementioned three errors (5) to (7) are caused when the chip pattern is printed on the layer where the alignment marks of each shot area on the wafer 8 have been printed. Actually, since these further receive an influence of the aforementioned errors (2) and (3) caused by the manufacturing process of the wafer 8, if the coordinates of the position where the alignment marks 29-n, 30-n, 34-n and 35-n should actually be on the stage coordinate system (X, Y) are made ($F_{NXn}$, $F_{NYn}$) (N=1 to 4), then these coordinate values ($F_{NXn}$, $F_{NYn}$) are shown by the following equation (6) and equation (7) from equation (2) and equation (4).

$$\begin{bmatrix} F_{NXn} \\ F_{NYn} \end{bmatrix} = \begin{bmatrix} R_x & -R_x \cdot (W+\Theta) \\ R_y \cdot \Theta & R_y \end{bmatrix} \left\{ \begin{bmatrix} C_{Xn} \\ C_{Yn} \end{bmatrix} + \begin{bmatrix} S'_{NXn} \\ S'_{NYn} \end{bmatrix} \right\} + \begin{bmatrix} O_X \\ O_Y \end{bmatrix} \quad (6)$$

$$\begin{bmatrix} F_{NXn} \\ F_{NYn} \end{bmatrix} = \begin{bmatrix} C'_{Xn} \\ C'_{Yn} \end{bmatrix} + \begin{bmatrix} S'_{NXn} \\ S'_{NYn} \end{bmatrix} \quad (7)$$

$$= \begin{bmatrix} R_x & -R_x \cdot (W+\Theta) \\ R_y \cdot \Theta & R_y \end{bmatrix} \begin{bmatrix} C_{Xn} \\ C_{Yn} \end{bmatrix} + \begin{bmatrix} O_X \\ O_Y \end{bmatrix} +$$

$$\begin{bmatrix} r_x & -r_x \cdot (w+\theta) \\ r_y \cdot \theta & r_y \end{bmatrix} \begin{bmatrix} S_{NXn} \\ S_{XYn} \end{bmatrix}$$

Next, to facilitate the application of the least-squares method, the α direction wafer scaling $R_x$ and the β direction wafer scaling $R_y$ in equation (6) and equation (7) are respectively shown as in the following equation (8), using new parameters $\Gamma_x$ and $\Gamma_y$.

Similarly, the x direction chip scaling $r_x$ and the y direction chip scaling $r_y$ in equation (6) and equation (7) are respectively shown as in the following equation (8), using new parameters $\gamma_x$ and $\gamma_y$.

$R_x=1+\Gamma_x, R_y=1+\Gamma_y,$ $\gamma_x=1+\gamma_x, \gamma_y=1+\gamma_y$ \quad (8)

If equation (6) and equation (7) are rewritten using these four new parameters $\Gamma_x$, $\Gamma_y$, $\gamma_x$, and $\gamma_y$ which respectively show the change in linear expansion and contraction, equation (6) and equation (7) become approximately like the following equations (9) and (10).

$$\begin{bmatrix} F_{NXn} \\ F_{NYn} \end{bmatrix} = \begin{bmatrix} 1+\Gamma_x & -(W+\Theta) \\ \Theta & 1+\Gamma_y \end{bmatrix} \left\{ \begin{bmatrix} C_{Xn} \\ C_{Yn} \end{bmatrix} + \begin{bmatrix} 1+\gamma_x & -(w+\theta) \\ \theta & 1+\gamma_y \end{bmatrix} \begin{bmatrix} S_{NXn} \\ S_{NYn} \end{bmatrix} \right\} + \begin{bmatrix} O_X \\ O_Y \end{bmatrix} \quad (9)$$

$$\begin{bmatrix} F_{NXn} \\ F_{NYn} \end{bmatrix} = \begin{bmatrix} 1+\Gamma_x & -(W+\Theta) \\ \Theta & 1+\Gamma_y \end{bmatrix} \begin{bmatrix} C_{Xn} \\ C_{Yn} \end{bmatrix} + \begin{bmatrix} 1+\gamma_x & -(w+\theta) \\ \theta & 1+\gamma_y \end{bmatrix} \begin{bmatrix} S_{NXn} \\ S_{NYn} \end{bmatrix} + \begin{bmatrix} O_X \\ O_Y \end{bmatrix} \quad (10)$$

In these equations (9) and (10), if a two dimensional vector is considered as a two line×one row matrix, these equations (9) and (10) can be respectively rewritten to the following coordinate transformation equations (11) and (12) which use transformation matrixes.

$$F_{Nn} = A\{C_n + BS_n\} + O \quad (11)$$

$$F_{Nn} = AC_n + BS_{Nn} + O \quad (12)$$

where each transformation matrix of the equations (11) and (12) is defined as follows.

$$F_{Nn} = \begin{bmatrix} F_{NXn} \\ F_{NYn} \end{bmatrix}, \quad A = \begin{bmatrix} 1+\Gamma_x & -(W+\Theta) \\ \Theta & 1+\Gamma_y \end{bmatrix} \quad (13)$$

$$B = \begin{bmatrix} 1+\gamma_x & -(w+\theta) \\ \theta & 1+\gamma_y \end{bmatrix}, \quad O = \begin{bmatrix} O_X \\ O_Y \end{bmatrix}$$

$$C_n = \begin{bmatrix} C_{Xn} \\ C_{Yn} \end{bmatrix}, \quad S_{Nn} = \begin{bmatrix} S_{NXn} \\ S_{NYn} \end{bmatrix}$$

The ten error parameters ($\Theta$, W, $\Gamma_x$ (=$R_x$-1), $\Gamma_y$, $O_X$, $O_Y$, $\theta$, w, $\gamma_x$ (=$r_x$-1), $\gamma_y$) included in the transformation matrices A, B, and O in the coordinate transformation equation of equation (11) or equation (12), can be obtained for example by the least-squares method.

Moreover, the calculation coordinates on the stage coordinate system (X, Y) of each shot area of the wafer 8, and the respective errors of the chip, are obtained based on the coordinate transformation equation of the equations (11) and (12). Then, based on this, after the chip rotation error and the chip magnification error etc. are corrected, alignment of each shot area of the wafer 8 with the reticle is performed.

When the array coordinates of each shot area on the wafer are calculated by using the aforementioned equation (9) or equation (10), the value of the ten error parameters ($\Box$, W, $R_x$, $R_y$, $O_X$, $O_Y$, $\theta$, w, $\gamma_x$, $\gamma_y$) of the aforementioned equation (9) or equation (10) need not be individually calculated, and only each element (parameter) of the aforementioned equation (9) or equation (10) (transformation matrices A, B, and O) need be obtained.

The least-squares method need not necessarily be applied to equation (11) and equation (12), and for instance, the ten error parameters can be obtained at the stage of equation (6) and equation (7).

Moreover, as explained hereunder, the coordinate positions of the further selected alignment marks are measured in the shot area (alignment shot area) selected beforehand from the shot areas on the wafer, and these measurement results are applied to equation (11) and equation (12), to obtain the ten parameters by the least-squares method, and the array coordinates of each shot area are calculated based on these parameters. The operation for obtaining a prescribed number of parameters (which can be up to 10) from the measurement results of the alignment marks (alignment shot area) selected beforehand in this manner, is called an enhanced global alignment (hereafter, "EGA") operation, and the method of performing alignment based on this result is called the EGA method.

Above is explained the wafer error correction method and the shot error correction method used in this embodiment.

When the wafer error correction method is used, the wafer error is corrected with respect to all wafers for which alignment is performed. Moreover, in the shot error correction method also, the shot error is corrected with respect to all wafers for which alignment is performed.

Therefore, when the wafer error correction method is used, since the number of times the alignment mark in the shot area is measured is minimal, the time required for the adjustment is short. However compared with the shot error correction method, the alignment accuracy is often worse.

On the other hand, when the shot area correction method is used, since the superposition error for each shot area can be corrected, the alignment accuracy is often increased, compared to with the wafer error correction method. However, there is a problem in that since a plurality of alignment marks must be measured in one alignment shot area, the measurement time becomes long and throughput decreases.

First Embodiment

Hereunder is a detailed description of an alignment method according to a first embodiment of the present invention performed to solve the abovementioned problem.

Figure 5:
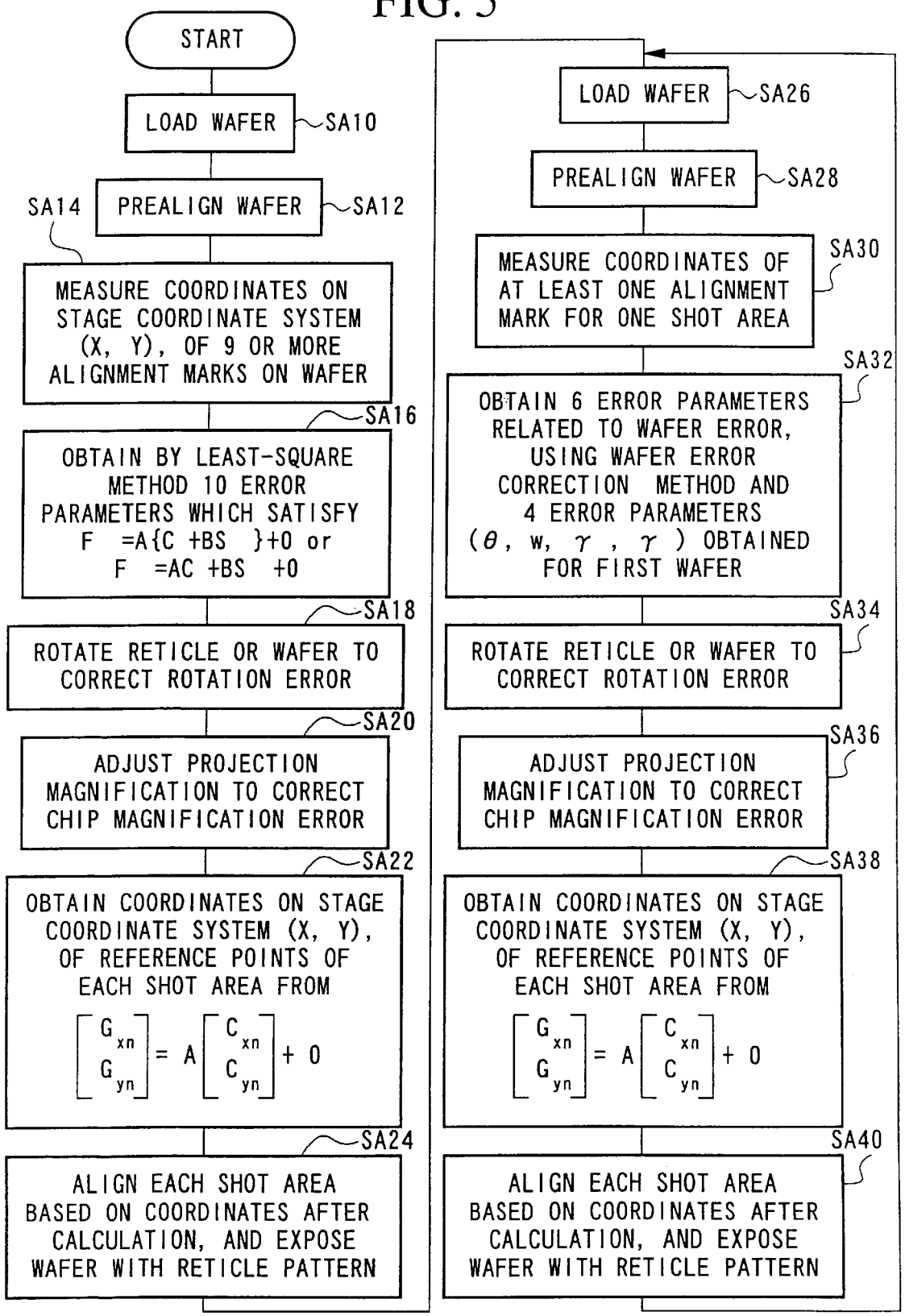
FIG. 5 is a flowchart showing a processing sequence in an alignment method according to a first embodiment of the present invention.

FIG. 5 is a flowchart showing the processing sequence of the alignment method according to the first embodiment of the present invention.

First of all, in step SA10 in FIG. 5 the wafer 8 which is the exposure object, is loaded onto the wafer holder 9. Here, the description is made giving as an example the case where the first wafer of each lot, in other words the wafer of the first piece of each lot, is loaded.

In each shot area of the wafer 8, the chip patterns have already been respectively formed in the former step.

In addition, as shown in FIG. 3B, the four cross type alignment marks 29-n, 30-n, 34-n, and 35-n are respectively formed in each shot area 27-n on the wafer 8. Moreover, alignment of the reticle 2 is completed, and the amount of the displacement in the X, Y and the rotation direction of the reticle 2 with respect to the rectangular coordinate system prescribed by the interferometer (not shown in the figure), becomes almost zero.

Next, in step SA12 of FIG. 5, the starting point of the wafer 8 is set (prealignment). Afterwards, in step SA14, coordinate values ($FM_{NXn}$, $FM_{NYn}$) on the stage coordinate system (X, Y) of the five or more alignment marks (29-n, 30-n, 34-n or 35-n) on the wafer 8 are measured using the off-axis alignment system 15 of FIG. 1.

Here, in this example, since equation (9) or equation (10) are used as the model function, it is necessary to form at least three alignment marks not on the same respective straight lines in the shot area on the wafer 8. Therefore, in this example as shown in FIG. 3B, four alignment marks (29-n), (30-n), (34-n), and (35-n) are formed. Consequently, for at least three of the four alignment marks (29-n), (30-n), (34-n), and (35-n), the coordinate values thereof are measured in at least three shot areas (alignment shot areas) not on the same respective straight lines. In this example, because the coordinate values of the X direction and Y direction of the four alignment marks (29-n), (30-n), (34-n), and (35-n) for each alignment shot area of are measured and at least three shot areas are selected as alignment shot areas, at least 24 coordinate values are obtained. Therefore, the values of the ten error parameters in the equations (9) and (10) can be determined.

In this example, while it is necessary to measure the coordinate values in at least three alignment shot areas for at least three of the four alignment marks (29-n), (30-n), (34-n), and (35-n), at least three alignment marks of each alignment shot area need not be detected, it being acceptable to detect only two alignment marks in one alignment shot area. In short, only the coordinate values in at least three alignment shot areas need be detected for each alignment mark, and for example for alignment mark (29-n) and alignment mark (34-n), a part or all of at least three alignment shot areas may be different.

In this case, design array coordinate values $(C_{Xn}, C_{Yn})$ in the coordinate system $(\alpha, \beta)$ on the wafer 8, of the reference point 28-n of a plurality of shot areas 27-n selected on the wafer 8, and the design coordinate values (relative coordinate values) $(S_{NXn}, S_{NYn})$ in the coordinate system (x, y) on each shot area 27-n of the measured alignment marks, are known beforehand.

Therefore, in step SA16, by substituting in the right side of equation (9) or equation (10), the design array coordinate values $(C_{Xn}, C_{Yn})$ of the reference point of the shot area to which the measured alignment mark belongs and the design relative coordinate values $(S_{NXn}, S_{NYn})$ related to the reference point of the alignment mark thereof, the design coordinate values $(F_{NXn}, F_{NYn})$ whose alignment mark should be on the stage coordinate system (X, Y) is obtained.

Then, the ten error parameters $(\Theta, W, \Gamma_x, \Gamma_y, O_X, O_Y, \Theta, w, \gamma_x, \gamma_y)$ which satisfy equation (11) or equation (12) are obtained by the least-squares method. More specifically, the difference $(E_{NXn}, E_{NYn})$ between the actually measured coordinate values $(FM_{NXn}, FM_{NYn})$ and the design coordinate values $(F_{NXn}, F_{NYn})$ is considered to be alignment error.

Therefore, $E_{NXn}=FM_{NXn}-F_{NXn}$ and $E_{Nyn}=FM_{Nyn}-F_{NYn}$ holds. Then, in this example, if the sum of the squares of the nine or more alignment errors $(E_{NXn}, E_{NYn})$ is sequentially partially differentiated for these ten error parameters, equations where the values thereof respectively become zero are established, and if these simultaneous equations are solved, the ten error parameters can be obtained.

In this example, since the aforementioned equation (9) or equation (10) are used as a model function, if at least three shot areas on the wafer 8 are selected as alignment shot areas, and at least three alignment marks detected for each alignment shot area, then nine or more alignment errors $(E_{NXn}, E_{NYn})$ are obtained. At this time, it is not necessary to detect two lots of position information (coordinate values in the X direction and the Y direction) for each alignment mark, and only one lot of position information need be detected in a part of at least three alignment shot areas. However, in this case at least four alignment shot areas are required.

Then in the next step SA18, a suitable rotation is given to the reticle 2 via the reticle stage 3 shown in FIG. 2, to correct the residual rotation error (wafer rotation error) $\Theta$ of the wafer in the transformation matrix A of equation (11) or equation (12), and the rotation error $\theta$ of the chip rotation in the transformation matrix B, or the wafer 8 is rotated to correct the rotation of the chip pattern with respect to the stage coordinate system (X, Y).

This means the reticle 2 or the wafer 8 is rotated to match the sum $(\Theta+\theta)$ of the residual rotation error $\Theta$ which constitutes the elements of the transformation matrix A shown by equation (11) or equation (12), and the rotation error $\theta$ which constitutes the elements of the transformation matrix B.

However, when the wafer 8 is rotated, because there is concern that the offset error $(O_X, O_Y)$ of the wafer 8 changes, it is necessary to perform a conventional normal EGA operation after again measuring the coordinate values of the alignment marks, and obtain and revise the error parameter.

Therefore, for example when the wafer 8 is rotated by only the angle $(\Theta+\theta)$, then as with the conventional case where the error in the chip pattern is not considered, the coordinate values are measured and revised in the stage coordinate system (X, Y) of the alignment marks in at least three shot areas on the wafer 8. Then from the result, the value of the six error parameters $(\Theta, W, R_x, R_y, O_X, O_Y)$ is determined, and based on the array coordinates calculated from the result, alignment in each shot area is performed and exposure carried out. This also has the meaning of verifying whether or not the new residual rotation error $\Theta$ after the wafer 8 is rotated is a value corresponding to the angle rotated through in step SA18.

After the web 8 is rotated, the coordinate values of each shot area may be calculated immediately using equation (9) or equation (10) from which the ten error parameters were calculated, and the wafer 8 moved according to the calculated array coordinates, and exposure performed for each shot area. That is, the value of the six error parameters need not be determined again.

Next, regarding the orthogonality error w of the chip, while this cannot be corrected in a strict meaning, the error can be kept small by appropriately rotating the reticle 2. Therefore, it is also possible to optimize the amount of the rotation of the reticle 2 so as to minimize the sum of the respective absolute values for the rotation error $\Theta$, the rotation error $\theta$, and the orthogonality error w.

Next, in step SA20, the projection magnification of the projection optical system 7 is adjusted by the imaging characteristics controller 14 of FIG. 1, so as to correct the chip scaling error in the transformation matrix B of equation (11) or equation (12). This means adjusting the projection magnification of the projection optical system 7 to match the chip scalings $r_x$ and $r_y$ which constitute the elements of the transformation matrix B shown by equation (9) or equation (10).

After this, in step SA22 of FIG. 5, using the transformation matrices A and O which contain the elements consisting of the error parameters obtained in step SA16, and substituting the design array coordinate values $(C_{Xn}, C_{Yn})$ of the reference point 28-n of each shot area 27-n on the wafer 8 in the following equation, the design array coordinate values $(G_{Xn}, G_{Yn})$ on the stage coordinate system (X, Y) of the reference points 28-n are obtained. However, as mentioned above, in order to correct the rotation error in step SA18, when the wafer 8 side is rotated, then based on the coordinates of the remeasured alignment marks, the design array coordinate values $(G_{Xn}, G_{Yn})$ on the stage coordinate system (X, Y) of the respective reference points 28-n are obtained.

Furthermore, in this example, when the reticle pattern is transferred to each shot area on the wafer, then on the wafer, the reference point 28-n of the shot area and the reference point (for example the center) of the reticle pattern (transfer image) coincide. Consequently, since $BS_{Nn}$ of the aforementioned equation (11) and equation (12) becomes zero, then in step SA22, the array coordinate values thereof are computed for each shot area using the belowmentioned equation (14).

However, when for example the reference point 28-n of the shot area and the reference point of the reticle pattern do not coincide, then $BS_{Nn}$ becomes other than zero, and using the transformation matrices A, B and O determined from the ten error parameters obtained in step SA16, the design array coordinate values ($C_{Xn}$, $C_{Yn}$) of the reference point 28-n are substituted in the abovementioned equation (9) or (10), and the design array coordinate values ($G_{Xn}$, $G_{Yn}$) of the reference point 28-n then computed. This operation is also the same in a latermentioned step SA38.

Depending on the rotation amount of the wafer 8, re-measurement of the alignment mark, and computation of the array coordinate value need not be performed.

$$\begin{bmatrix} G_{Xn} \\ G_{Yn} \end{bmatrix} = A \begin{bmatrix} C_{Xn} \\ C_{Yn} \end{bmatrix} + O \quad (14)$$

Then, in step SA24, the reference point 28-n of each shot area 27-n on the wafer 8 is aligned with a prescribed position within the exposure field of the projection optical system 7 of FIG. 1 sequentially, based on the array coordinates ($G_{Xn}$, $G_{Yn}$) obtained by calculation, and the previously obtained base line amount, and the relevant shot areas 27-n is projection exposed with the pattern image of the reticle 2. Then, after completing exposure of all of the shot areas on the wafer 8, the wafer 8 is unloaded, and processing such as development performed.

In the above, processing of the first wafer of the lot is complete. As described above, accurate alignment is performed using the shot error correction method, with respect to this wafer.

By means of the above processing, the ten error parameters ($\Theta$, W, $\Gamma_x$, $\Gamma_y$, $O_X$, $O_Y$, $\theta$, w, $\gamma_x$, $\gamma_y$) which contain the four error parameters ($\theta$, w, $\gamma_x$, $\gamma_y$) as shot errors are obtained.

As mentioned before, in the wafer error correction method, if for the wafer error there are six error parameters ($\Theta$, W, $\Gamma_x$, $\Gamma_y$, $O_X$, $O_Y$), then the wafer error can be corrected.

Here, the part to be careful of is that the six error parameters ($\Theta$, W, $\Gamma_x$, $\Gamma_y$, $O_X$, $O_Y$) computed by the wafer error correction method are different from the six error parameters ($\Theta$, W, $\Gamma_x$, $\Gamma_y$, $O_X$, $O_Y$) inside the ten error parameters computed by the shot error correction method.

Thereafter, the processing for the second and subsequent wafers is performed. With respect to the second and subsequent wafers, the wafer error is computed by a wafer error correction method where the number of alignment marks of the plurality of alignment marks formed in the shot area, which should detect the position information (coordinate value), is less than with the shot error correction method. In the wafer error measurement method, as mentioned above, only the six error parameters ($\Theta$, W, $\Gamma_x$, $\Gamma_y$, $O_X$, $O_Y$) are obtained as wafer errors.

In this embodiment, the four error parameters ($\theta$, w, $\gamma_x$, $\gamma_y$) are used in the ten error parameters obtained by the processing for the first wafer, and based on these, the six error parameters ($\Theta$, W, $\Gamma_x$, $\Gamma_y$, $O_X$, $O_Y$) obtained by the wafer error measurement method are corrected, and the error of the shot area is corrected using the ten error parameters.

As mentioned before, the six error parameters ($\theta$, W, $\Gamma_x$, $\Gamma_y$, $O_X$, $O_Y$) used in the wafer error correction method, and the six error parameters ($\Theta$, W, $\Gamma_x$, $\Gamma_y$, $O_X$, $O_Y$) within the ten error parameters used in the shot error correction method have different values. Therefore, hereunder the six error parameters used in the wafer error correction method are denoted by $[\Theta]_W$, $[W]_W$, $[\Gamma_x]_W$, $[\Gamma_y]_W$, $[O_X]_W$, $[O_Y]_W$, and the six error parameters within the ten error parameters used in the shot error correction method are denoted by $[\Theta]_S$, $[W]_S$, $[\Gamma_x]_S$, $[\Gamma_y]_S$, $[O_X]_S$, $[O_Y]_S$.

Next, in step SA26 in FIG. 5, the wafer 8 which is the exposure object, is loaded onto the wafer holder 9 of FIG. 1. In this embodiment, the wafer is the second wafer in each lot.

On each shot area of this wafer 8 also, chip patterns have already been formed in a former step.

Furthermore, as with the first wafer, as shown in FIG. 3B, the four cross shape alignment marks 29-n, 30-n, 34-n, and 35n are respectively formed in each slot area 27-n on the wafer 8. Moreover, alignment of the reticle 2 is completed, and the amount of the displacement in the X, Y and the rotation direction of the reticle 2 with respect to the rectangular coordinate system prescribed by the interferometer (not shown in the figure), becomes almost zero.

However, when the reticle used in the exposure of the first wafer, and the reticle used in the exposure of the second wafer are the same, since alignment of the reticle is completed before exposure of the first wafer, then here the alignment of the reticle 2 need not be performed.

Next, in step SA28 of FIG. 5, the starting point of the wafer 8 is set (prealignment). Afterwards, in step SA30, coordinate values on the stage coordinate system (X, Y) of at least one alignment mark (29-n, 30-n, 34-n or 35-n) for each shot area are measured using the off-axis alignment system 15 of FIG. 1.

For each shot area of the wafer, a plurality of alignment marks (in the examples shown in FIGS. 3A, 3B and FIGS. 4B, 4C, four cross shaped alignment marks (29-n, 30-n, 34-n, 35-n) are formed. However with respect to the second wafer and thereafter, it is not necessary to measure all of these, and at least one alignment mark is measured, and from the measurement result (including at least one for each of the coordinate values for the X and Y direction) the array coordinate values ($G_{Xn}$, $G_{Yn}$) of the reference point 28-n are computed.

For the second and subsequent wafers, as mentioned before, only the six error parameters $[\Theta]_W$, $[W]_W$, $[\Gamma_x]_W$, $[\Gamma_y]_W$, $[O_X]_W$, $[O_Y]_W$ need be computed. Consequently, in step SA30 of FIG. 5, at least three shot areas are selected as alignment shot areas, and at least one alignment mark is detected for each alignment shot area to obtain two lots of position information (coordinate values in the X and Y direction).

In this embodiment, if the wafer is in the same lot, the case is assumed where the fluctuations in the shot error thereof is considered to be so small as to be able to be disregarded. Consequently, against obtaining the ten error parameters for the first wafer, only the six error parameters $[\Theta]_W$, $[W]_W$, $[\Gamma_x]_W$, $[\Gamma_y]_W$, $[O_X]_W$, $[O_Y]_W$ related to wafer error are obtained for the second and subsequent wafers, and the four error parameters ($\theta$, w, $\gamma_x$, $\gamma_y$) related to the shot error use the result obtained for the first wafer.

However, in obtaining these six error parameters, the aforementioned equation (2) is not used, but the aforementioned equation (9) or (10) is used. This is because in this embodiment, if the aforementioned equation (2) is used, the six error parameters are calculated with the short error component being the wafer error component, and hence alignment error appears in the second and subsequent wafers, that is to say an error is generated in the calculation array coordinate values of the shot area (reference point).

Therefore, in step SA32 of FIG. 5, the four error parameters ($\Theta$, w, $\gamma_x$, $\gamma_y$) obtained for the first wafer are substituted in the aforementioned equation (9) or equation (10), and then using the plurality of position information (coordinate values) measured in step SA30, the six error parameters $[\Theta]_W, [W]_W, [\Gamma_x]_W, [\Gamma_y]_W, [O_x]_W, [O_y]_W$ are obtained by, for example, the least-squares method.

Then in step SA34, a suitable rotation is given to the reticle 2 via the reticle stage 3 of FIG. 2, to correct the residual rotation error (wafer rotation error) $\Theta$ of the wafer in the transformation matrix A of equation (11) or equation (12), and the rotation error $\theta$ of the chip rotation in the transformation matrix B, or the wafer 8 is rotated to correct the rotation of the chip pattern with respect to the stage coordinate system (X, Y).

This means that the reticle 2 or the wafer 8 is rotated to match the sum ($\Theta+\theta$) of the residual rotation error $\Theta$ which constitutes the elements of the transformation matrix A shown by equation (11) or equation (12), and the rotation error $\theta$ which constitutes the elements of the transformation matrix B. As a result, the relative rotation error for the pattern of the reticle 2 and each shot area on the wafer 8 becomes approximately zero.

Here the respective transformation matrices of equation (11) or equation (12) are defined by equation (13).

Next, in step SA36, the projection magnification of the projection optical system 7 is adjusted via the imaging characteristics controller 14 of FIG. 1 so as to correct the chip scaling error in the transformation matrix B of equation (11) or equation (12). This means adjusting the projection magnification of the projection optical system 7 to match with the chip scaling $r_x$ and $r_y$ constituting the elements of the transformation matrix B shown by equation (9) or equation (10). As a result, the magnification error for the projection image of the pattern of the reticle 2 and each shot area on the wafer 8 becomes approximately zero.

After this, in step SA38 of FIG. 5, using the transformation matrices A and O which contain the elements consisting of the six error parameters obtained in step SA32, and substituting the design array coordinate values ($C_{Xn}$, $C_{Yn}$) of the reference point 28-n of each shot area 27-n on the wafer 8 in equation (14), the design array coordinate values ($G_{Xn}$, $G_{Yn}$) on the stage coordinate system (X, Y) of the reference points 28-n are obtained.

Instead of using equation (14), equation (9) or equation (10) in which are substituted the four error parameters ($\theta$, w, $\gamma_x$, $\gamma_y$) related to the shot error obtained for the first wafer, and the six error parameters $[\Theta]_W$, $[W]_W$, $[\Gamma_x]_W$, $[\Gamma_y]_W$, $[O_x]_W$, $[O_y]_W$ obtained in step SA32, may be used.

Then, in step SA40, the reference point 28-n of each shot area 27-n on the wafer 8 is aligned with a prescribed position within the exposure field of the projection optical system 7 of FIG. 1 sequentially, based on the array coordinates ($G_{Xn}$, $G_{Yn}$) obtained by calculation, and the previously obtained base line amount, and the relevant shot areas 27-n is projection exposed with the pattern image of the reticle 2. Projection exposure is performed by respectively transferring pattern of the reticle to the plurality of shot areas using a step-and-repeat method or a step-and-scan method. Then, after exposure to all of the shot areas on the wafer 8 has been completed, the wafer 8 is unloaded, and processing such as development is performed.

In the above, processing of the second wafer of the lot is complete. As described, with respect to this wafer, the number of measurements of the alignment marks provided in the shot region is reduced, enabling an improvement in throughput.

However, the error of the shot area is considered using the four error parameters ($\theta$, w, $\gamma_x$, $\gamma_y$) within the ten error parameters used in the shot error correction method, which are obtained at the time of processing the first wafer with respect to each shot area, and the wafer error used in the wafer correction method is corrected.

Consequently, an improvement in throughput is achieved, and since consideration is given not only to the transformation matrices A and O, but also to the transformation matrix B constituting the parameters of the orthogonality error of the chip and the chip scaling, the influence such as expansion and contraction and rotation of the chip pattern itself which is transferred to each shot area can be kept to a minimum. Hence the chip pattern of each shot area on the wafer and the projection image of the patterns of the reticle can be superimposed to a higher accuracy.

With respect to the third and subsequent wafers of the lot, the processing returns to step SA26, and processing the same as for the second wafer of the lot is repeated.

In the abovementioned embodiment, the description is for the case where the processing is started from the first wafer of the lot. However there is no limitation to this, and processing may be performed with respect to optional wafers of the lot from SA10 to SA24 of FIG. 5, and with respect to the subsequent wafers, processing shown in steps SA26 through SA40 in FIG. 5 may be performed.

Furthermore, in the processing of step SA30 in FIG. 5, the description is given for the case where one alignment mark is measured for one shot area. However there is no limitation to this, and a plurality of alignment marks may be measured.

For example, in the case where the shot area is a square as shown in FIG. 3B, and the alignment marks are formed at the four corners of the shot area, then preferably two alignment marks on one diagonal are measured.

When detecting a plurality of alignment marks belonging to one shot area, the plurality of coordinate values obtained by detecting the plurality of alignment marks may be averaged and handled as one coordinate value. That is to say, this average value may be used as a coordinate value (measurement value) of the shot area. Alternatively, respective weightings may be performed for a plurality of coordinate values to determine one coordinate value.

In this case, the array coordinate values of the reference point 28-n within the slot area may be obtained based on a plurality of measurement alignment marks. Therefore alignment to an even higher accuracy may be performed.

Furthermore, in the abovementioned embodiment, alignment is performed using the shot error correction method only with respect to the first wafer of the lot. With respect to the second and subsequent wafers, only the six error parameters related to the wafer error are obtained, and the four error parameters ($\theta$, w, $\gamma_x$, $\gamma_y$) related to the shot error use the result obtained for the first wafer. That is to say, alignment is performed using the wafer error correction method. However the shot error correction method may be performed for each of a prescribed number of wafers.

In the abovementioned embodiment, as shown in FIG. 3B, cross shape alignment marks 29-n through 35-n which can be simultaneously aligned with the X direction and the Y direction on the stage coordinate system, are doubly provided on the X-axis, and doubly provided on the Y-axis of the coordinate system of the shot area. However, if for example four alignment marks are not arranged on one straight line, then such an arrangement is not necessary.

As an example, alignment marks may be arranged for example at four corners of each shot area. Furthermore, the respective alignment marks may be formed on a street line area between each shot area. Moreover, the one dimensional alignment mark for the X direction and the one dimensional alignment mark for the Y direction may be each provided separately, and if care is taken in their arrangement, the transformation matrices A, B and O of the equation (11) or equation (12) may be obtained in exactly the same way as for the abovementioned embodiment.

However, at the time of processing the first wafer, in the case where instead of the cross shape mark which can specify a two dimensional position, a one dimensional alignment mark (diffraction grating mark etc.) which can detect only positions in the X direction or the Y direction is used, then in order to determine the value of the ten error parameters, it is necessary to measure the coordinate values of ten or more one dimensional alignment marks.

In the aforementioned embodiment, in order to obtain the rotation error θ of the chip rotation, the orthogonality error w of the chip, and the chip scaling $r_x$, $r_y$, four two dimensional alignment marks 29-n through 35-n are provided inside each shot area 27n of the wafer 8.

However, even if offset (x direction and y direction) of the reference point of each shot area 27-n is considered, since there are six error parameters to be obtained, then only three two dimensional alignment marks (for example 29-n, 30-n and 34-n) need be provided in each shot area 27-n. When in this way two dimensional alignment marks are used, at all times two alignment marks are selected. However, if these are one dimensional alignment marks, it is necessary to respectively form six alignment marks in each shot area 27-n.

In the abovementioned embodiment, correction of the rotation of the reticle (or wafer) and of the magnification of the projection optical system is carried out using the four error parameters related to the chip pattern (rotation error θ of the chip rotation, orthogonality error w, chip scaling $r_x$, and chip scaling $r_y$). However, it is not always necessary to perform correction of the rotation of the reticle (or wafer) or of the magnification of the projection optical system, and it is sufficient to only align each shot area in accordance with the array coordinate values obtained in the aforementioned embodiment. At this time, magnification correction may or may not be carried out using for example, the scaling parameters $R_x$ and $R_y$ (or $\Gamma_x$ and $\Gamma_y$) related to the wafer.

Furthermore, in the aforementioned embodiment, all of the four error parameters related to the chip pattern (rotation error θ of the chip rotation, orthogonality error w, chip scaling $r_x$, $(=1+\gamma_x)$ and chip scaling $r_y(=1+\gamma_y)$) are obtained. However equation (6) or equation (7) (or equation (9) or equation (10)) may be used paying attention to only one of these four. More specifically, in the case where attention is paid to only the rotation error θ, equation (6) or equation (7) are used with the orthogonality error w considered to be zero, and chip scalings $r_x$ and $r_y$ considered to each be one. On the other hand, in the case where attention is paid to the chip scalings $r_x$ and $r_y$, equation (6) or equation (7) may be used with $r_x=r_y$, that is, with the linear expansion and contraction isotropic.

The parameters observed from inside the four error parameters may be selected corresponding for example to the type (characteristics) of the wafer which is the exposure object. Next is a description of examples of alignment marks which can actually be used, with reference to FIG. 6.

FIG. 6 is a diagram showing examples of alignment marks.

Figure 6A:
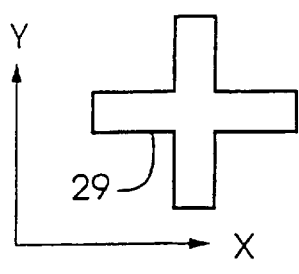
FIG. 6A to FIG. 6C are diagrams showing examples of alignment marks.
Figure 6B:
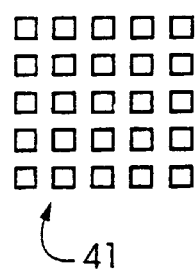

At first, for an alignment mark for showing two dimensional coordinates (two dimensional mark), then other than the cross shape alignment mark 29 used in the aforementioned embodiment (this is also shown in FIG. 6A), there is the L-shape, T-shape or the ╱╲-shape marks. Furthermore, in the case where an alignment system of the so called two beam interference method or the laser step alignment method is used, then as shown in FIG. 6B, a two dimensional lattice pattern 42 also becomes a two dimensional mark.

Figure 6C:
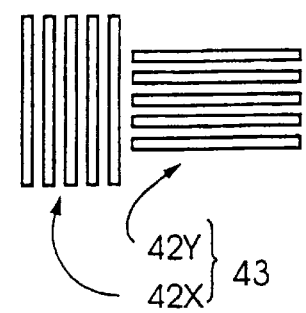

Moreover, in the case where an alignment system of a laser step alignment method or an alignment system of an imaging method as with the aforementioned embodiment is used, then as shown in FIG. 6C, alignment marks 43 where a line-and-space pattern 42x in the X direction and a line-and-space pattern 42y in the Y direction are lined up in parallel, also becomes a two dimensional mark.

If one of such two dimensional marks is selected, then two lots of data, namely the X coordinate and the Y coordinate are obtained as the data when obtaining the ten (or a number less than this) error parameters of equation (11) or equation (12) by the least-squares method. Consequently, when in the above embodiment, one cross shape alignment mark (for example 29-1) is selected, this is equivalent, to selecting two alignment marks (one dimensional marks) showing one dimension coordinates. However, even in the case where two dimensional marks are selected, it is sufficient to use only one coordinate data of either the X coordinate or the Y coordinate.

Figure 7A:
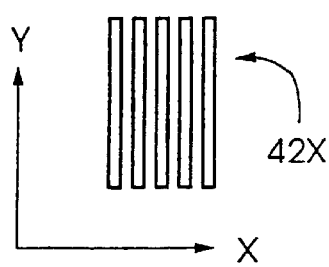
FIG. 7A and FIG. 7B are diagrams showing examples of one-dimensional alignment marks.
Figure 7B:
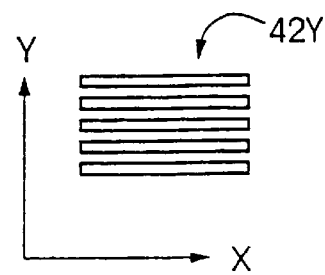

Furthermore, FIGS. 7A, and 7B are diagrams showing one dimensional alignment marks.

As a mark showing the coordinates of the X direction in a one dimensional mark, there is the line-and-space pattern (or diffraction grating mark) 42X arranged at a prescribed pitch in the X direction as shown in FIG. 7A, while as a mark showing the coordinates of the Y direction, there is the line-and-space pattern (or diffraction grating mark) 42Y arranged at a prescribed pitch in the Y direction as shown in FIG. 7B. Furthermore, the two dimensional lattice pattern 41 of FIG. 6B can be regarded as a one dimensional mark in the X direction, or can be regarded as a one dimensional mark in the Y direction.

Second Embodiment

Next is a detailed description of an alignment method according to a second embodiment of the present invention.

FIG. 8 is a flowchart showing the processing sequence of the alignment method according to the second embodiment of the present invention.

First of all, in step SB10 in FIG. 8 the wafer 8 which is the exposure object, is loaded onto the wafer holder 9. Here, the description is made giving as an example the case where the first wafer of each lot, in other words the wafer of the first piece of each lot, is loaded.

In each shot area of the wafer 8, the chip patterns have already been respectively formed in the former step.

In addition, as shown in FIG. 3B, the four cross type alignment marks 29-n, 30-n, 34-n, and 35-n are respectively formed in each shot area 27-n on the wafer 8. Moreover, alignment of the reticle 2 is completed, and the amount of the displacement in the X, Y and the rotation direction of the reticle 2 with respect to the rectangular coordinate system prescribed by the interferometer (not shown in the figure), becomes almost zero.

Next, in step SB12 of FIG. 8, the starting point of the wafer 9 is set (prealignment). Afterwards, in step SB14, coordinate values ($FM_{NXn}$, $FM_{NYn}$) on the stage coordinate system (X, Y) of the five or more alignment marks (29-n, 30-n, 34-n or 35-n) on the wafer 8 are measured using the off-axis alignment system 15 of FIG. 1.

Here, in this example, since equation (9) or equation (10) are used as the model function, it is necessary to form at least three alignment marks not on the same straight line in the shot area on the wafer 8. Therefore, in this example as shown in FIG. 3B, four alignment marks (29-n), (30-n), (34-n), and (35-n) are formed. Consequently, for at least three of the four alignment marks (29-n), (30-n), (34-n), and (35-n), the coordinate values thereof are measured in at least three shot areas (alignment shot areas) not on the same straight line. In this example, because the coordinate values of the X direction and Y direction of the four alignment marks (29-n), (30-n), (34-n), and (35-n) for each alignment shot area of are measured and at least three shot areas are selected as alignment shot areas, at least 24 coordinate values are obtained. Therefore, the values of the ten error parameters in the equations (9) and (10) can be determined.

In this example, while it is necessary to measure the coordinate values in at least three alignment shot areas for at least three of the four alignment marks (29-n), (30-n), (34-n), and (35-n), at least three alignment marks of each alignment shot area need not be detected, it being acceptable to detect only two alignment marks in one alignment shot area. In short, only the coordinate values in at least three alignment shot areas need be detected for each alignment mark, and for example for alignment mark (29-n) and alignment mark (34-n), a part or all of at least three alignment shot areas may be different.

In this case, design array coordinate values $(C_{Xn}, C_{Yn})$ in the coordinate system $(\alpha, \beta)$ on the wafer 8, of the reference point 28-n of a plurality of shot areas 27-n selected on the wafer 8, and the design coordinate values (relative coordinate values) $(S_{NXn}, S_{NYn})$ in the coordinate system $(x, y)$ on each shot area 27-n of the measured alignment marks, are known beforehand.

Therefore, in step SA16, by substituting in the right side of equation (9) or equation (10), the design array coordinate values $(C_{Xn}, C_{Yn})$ of the reference point of the shot area to which the measured alignment mark belongs and the design relative coordinate values $(S_{NXn}, S_{NYn})$ related to the reference point of the alignment mark thereof, the design coordinate values $(F_{NXn}, F_{NYn})$ whose alignment mark should be on the stage coordinate system (X, Y) is obtained.

Then, the ten error parameters $(\Theta, W, \Gamma_x, \Gamma_y, O_X, O_Y, \theta, w, \gamma_x, \gamma_y)$ which satisfy equation (11) or equation (12) are obtained by the least-squares method. More specifically, the difference $(E_{NXn}, E_{NYn})$ between the actually measured coordinate values $(FM_{NXn}, FM_{NYn})$ and the design coordinate values $(F_{NXn}, F_{NYn})$ is considered to be alignment error.

Therefore, $E_{NXn}=FM_{NXn}-F_{NXn}$ and $E_{Nyn}=FM_{Nyn}-F_{NYn}$ holds. Then, in this example, if the sum of the squares of the nine or more alignment errors $(E_{NXn}, E_{NYn})$ is sequentially partially differentiated for these ten error parameters, equations where the values thereof respectively become zero are established, and if these ten simultaneous equations are solved, the ten error parameters can be obtained.

In this example, since the aforementioned equation (9) or equation (10) are used in a model function, if at least three shot areas on the wafer 8 are selected as alignment shot areas, and at least three alignment marks detected for each alignment shot area, then nine or more alignment errors $(E_{NXn}, E_{NYn})$ are obtained. At this time, it is not necessary to detect two lots of position information (coordinate values in the X direction and the Y direction) for each alignment mark, and only one lot of position information need be detected in a part of at least three alignment shot areas. However, in this case at least four alignment shot areas are required.

In this embodiment, only the four error parameters $(\theta, w, \gamma_x, \gamma_y)$ related to the shot error of the ten error parameters $[\Theta]_S, [W]_S, [\Gamma_x]_S, [\Gamma_y]_S, [O_X]_S, [O_Y]_S, \theta, w, \gamma_x, \gamma_y$ obtained in step SB16 are used. Then, in step SB18 of FIG. 8, the wafer error correction method, and the four error parameters $(\theta, w, \gamma_x, \gamma_y)$ obtained in step SB16 are used, and the six error parameters $[\Theta]_W, [W]_W, [\Gamma_x]_W, [\Gamma_y]_W, [O_X]_W, [O_Y]_W$ related to the wafer error obtained. That is, the four error parameters $(\theta, w, \gamma_x, \gamma_y)$ obtained in step SB16 are substituted in the aforementioned equation (9) or equation (10), and then using the plurality of position information (coordinate values) measured in step SB14, the six error parameters thereof are obtained, for example, by the least-squares method. However, in the computation (step SB18) for the six error parameters related to the wafer error, the measurement result (coordinate value) for the alignment mark for where the alignment mark used in the computation of the six error parameters related to the wafer error for the second and subsequent wafers, and the design coordinate values are the same, is used.

Then in the next step SB20, a suitable rotation is given to the reticle 2 via the reticle stage 3 of FIG. 2, to correct the residual rotation error (wafer rotation error) $\Theta$ of the wafer in the transformation matrix A of equation (11) or equation (12), and the rotation error $\theta$ of the chip rotation in the transformation matrix B, or the wafer 8 is rotated to correct the rotation of the chip pattern with respect to the stage coordinate system (X, Y).

This means the reticle 2 or the wafer 8 is rotated to match the sum $(\Theta+\theta)$ of the residual rotation error $\Theta$ which constitutes the elements of the transformation matrix A shown by equation (11) or equation (12), and the rotation error $\theta$ which constitutes the elements of the transformation matrix B.

However, when the wafer 8 is rotated, because there is concern that the offset error $(O_X, O_Y)$ of the wafer 8 changes, it is necessary to perform a conventional normal EGA operation after again measuring the coordinate values of the alignment marks, and obtain and revise the error parameters.

Therefore, for example when the wafer 8 is rotated by only the angle $(\Theta+\theta)$, then as with the conventional case where the error in the chip pattern is not considered, the coordinate value are measured and revised in the stage coordinate system (X, Y) of the alignment marks in at least three shot areas on the wafer 8. Then from the result, the value of the six error parameters $(\Theta, W, R_x, R_y, O_X, O_Y)$ is determined, and based on the array coordinate calculated from the result, alignment in each shot area is performed and exposure carried out. This also has the meaning of verifying whether or not the new residual rotation error $\Theta$ after the wafer 8 is rotated is a value corresponding to the angle rotated through in step SB18.

After the wafer 8 is rotated, the coordinate values of each shot area may be calculated immediately using equation (9) or equation (10) from which the ten error parameters were calculated, and the wafer 8 moved according to the calculated array coordinates, and exposure performed for each shot area. That is, the value of the six error parameters need not be determined again.

Next, regarding the orthogonality error w of the chip, while this cannot be corrected in a strict meaning, the error can be kept small by appropriately rotating the reticle 2. Therefore, it is also possible to optimize the amount of the rotation of the reticle 2 so as to minimize the sum of the respective absolute values for the rotation error $\Theta$, the rotation error $\theta$, and the orthogonality error w.

Next, in step SB22, the projection magnification of the projection optical system 7 is adjusted by the imaging characteristics controller 14 of FIG. 1, so as to correct the chip scaling error in the transformation matrix B of equation (11) or equation (12). This means adjusting the projection magnification of the projection optical system 7 according to the chip scalings $r_x$ and $r_y$ which constitute the elements of the transformation matrix B shown by equation (9) or equation (10).

After this, in step SB24 of FIG. 8, using the transformation matrices A and O which contain the elements consisting of the error parameters corrected in step SB18, and substituting the design array coordinate values ($C_{Xn}$, $C_{Yn}$) of the reference point 28-n of each shot area 27-n on the wafer 8 in equation (14), the design array coordinate values ($G_{Xn}$, $G_{Yn}$) on the stage coordinate system (X, Y) of the reference points 28-n are obtained. However, as mentioned above, in order to correct the rotation error in step SB18, when the wafer 8 side is rotated, then based on the coordinates of the remeasured alignment marks, the design array coordinate values ($G_{Xn}$, $G_{Yn}$) on the stage coordinate system (X, Y) of the respective reference points 28-n are obtained.

Furthermore, in this embodiment, when the reticle pattern is transferred to each shot area on the wafer, then on the wafer, the reference point 28-n of the shot area and the reference point (for example the center) of the reticle pattern (transfer image) coincide. Consequently, since $BS_{Nn}$ of the aforementioned equation (11) and equation (12) becomes zero, then in step SB24, the array coordinate values thereof are computed for each shot area using equation (14). However, when for example the reference point 28-n of the shot area and the reference point of the reticle pattern do not coincide, then $BS_{Nn}$ becomes other than zero, and using the transformation matrices A, B and O determined from the four error parameters related to the shot error obtained in step SB16 and the six error parameters related to the wafer error obtained in step SB18, the design array coordinate values ($C_{Xn}$, $C_{Yn}$) of the reference point 28-n are substituted in the abovementioned equation (9) or (10), and the design array coordinate values ($G_{Xn}$, $G_{Yn}$) of the reference point 28-n then computed. This operation is also the same in a latermentioned step SB40.

Note that depending on the rotation amount of the wafer 8, re-measurement of the alignment mark, and computation of the array coordinate value need not be performed.

Then, in step SB26, the reference point 28-n of each shot area 27-n on the wafer 8 is aligned with a prescribed position within the exposure field of the projection optical system 7 of FIG. 1 sequentially, based on the array coordinates ($G_{Xn}$, $G_{Yn}$) obtained by calculation, and the previously obtained base line amount, and the pattern image of the reticle 2 is projection exposed with respect to the relevant shot areas 27-n. Then, after completing exposure of all of the shot areas on the wafer 8, the wafer 8 is unloaded, and processing such as development performed.

In the above, processing of the first wafer of the lot is complete.

The point where the processing for the first wafer of the first embodiment, and the processing for the first wafer of the second embodiment differs, is the point that in the first embodiment, the error is corrected by the shot error correction method only and alignment performed, whereas in the second embodiment, the error parameters are obtained using the wafer error correction method, and also the error parameters are obtained using the shot error correction method, and the error parameters used in the wafer error correction method are corrected using a part of the error parameters used in the shot error correction method.

Thereafter, the processing for the second and subsequent wafers is performed. With respect of the second and subsequent wafers, the wafer error is computed by a wafer error correction method where the number of alignment marks of the plurality of alignment marks formed in the shot area, which measure the coordinate value, is less than with the shot error correction method. In the wafer error measurement method, as mentioned above, only the six error parameters ($\Theta$, W, $\Gamma_x$, $\Gamma_y$, $O_X$, $O_Y$) are obtained as wafer errors.

In this embodiment, the four error parameters ($\theta$, w, $\gamma_x$, $\gamma_y$) are used in the ten error parameters obtained by the processing for the first wafer, and based on these, the six error parameters ($\Theta$, W, $\Gamma_x$, $\Gamma_y$, $O_X$, $O_Y$) obtained by the wafer error measurement method are corrected, and the error of the shot area is corrected using the ten error parameters.

Next, in step SB28 in FIG. 8, the wafer 8 which is the exposure object, is loaded onto the wafer holder 9 of FIG. 1. In this embodiment, the wafer is the second wafer in each lot.

On each shot area of this wafer 8 also, chip patterns have already been formed in a former step.

Furthermore, as with the first wafer, as shown in FIG. 3B, the four cross shape alignment marks 29-n, 30-n, 34-n, and 35-n are respectively formed in each shot area 27-n on the wafer 8. Moreover, alignment of the reticle 2 is completed, and the amount of the displacement in the X, Y and the rotation direction of the reticle 2 with respect to the rectangular coordinate system prescribed by the interferometer (not shown in figure), becomes almost zero.

Next, in step SB30 of FIG. 8, the starting point of the wafer 8 is set (prealignment). Afterwards, in step SB32, coordinate values on the storage coordinate system (X, Y) of at least one alignment mark (29-n, 30-n, 34-n or 35-n) for each shot area are measured using the off-axis alignment system 15 of FIG. 1.

For each shot area of the wafer, a plurality of alignment marks (in the examples shown in FIGS. 3A, 3B and FIGS. 4B, 4C, four cross shaped alignment marks (29-n, 30-n, 34-n, 35-n) are formed. However with respect to the second wafer and thereafter, it is not necessary to measure all of these, and at least one alignment mark is measured, and from the measurement result (indicating at least one for each of the coordinate values for the X and Y direction) the array coordinate values ($G_{Xn}$, $G_{Yn}$) of the reference point 28-n are computed.

For the second and subsequent wafers, as mentioned before, only the six error parameters $[\Theta]_W$, $[W]_W$, $[\Gamma_x]_W$, $[\Gamma_y]_W$, $[O_X]_W$, $[O_y]_W$ need be computed. Consequently, in step SB32 of FIG. 8, at least three shot areas are selected as alignment shot areas, and at least one alignment mark is detected for each alignment shot area to obtain two lots of position information (coordinate values in the X and Y direction).

In this embodiment, if the wafer is in the same lot, the case is assumed where the fluctuations in the shot error thereof is considered to be so small as to be able to be disregarded. Consequently, against obtaining the ten error parameters for the first wafer, only the six error parameters $[\Theta]_W$, $[W]_W$, $[\Gamma_x]_W$, $[\Gamma_y]_W$, $[O_X]_W$, $[O_y]_W$ related to wafer error are obtained for the second and subsequent wafers, and the four error parameters ($\theta$, w, $\gamma_x$, $\gamma_y$) related to the shot error use the result obtained for the first wafer.

However, in obtaining these six error parameters, the aforementioned equation (2) is not used, but the aforementioned equation (9) or (10) is used. This is because in this embodiment, if the aforementioned equation (2) is used, the six error parameters are calculated with the shot error component being the wafer error component, and hence alignment error appears in the second and subsequent wafers, that is to say an error is generated in the calculation array coordinate values of the shot area (reference point).

Therefore, in step SA34 of FIG. 8, the four error parameters ($\theta$, w, $\gamma_x$, $\gamma_y$) obtained for the first wafer are substituted in the aforementioned equation (9) or equation (10), and then using the plurality of position information (coordinate values) measured in step SB32, the six error parameters $[\Theta]_W$, $[W]_W$, $[\Gamma_x]_W$, $[\Gamma_y]_W$, $[O_X]_W$, $[O_Y]_W$ are obtained by, for example, the least-squares method.

Then in step SA34, a suitable rotation is given to the reticle 2 via the reticle stage 3 of FIG. 2, to correct the residual rotation error (wafer rotation error) $\Theta$ of the wafer in the transformation matrix X of equation (11) or equation (12), and the rotation error $\theta$ of the chip rotation in the transformation matrix B, or the wafer 8 is rotated to correct the rotation of the chip pattern with respect to the stage coordinate system (X, Y).

This means that the reticle 2 or the wafer 8 is rotated to match the sum ($\Theta+\theta$) of the residual rotation error $\Theta$ which constitutes the elements of the transformation matrix A shown by equation (11) or equation (12), and the rotation error $\theta$ which constitutes the elements of the transformation matrix B. As a result, the relative rotation error for the pattern of the reticle 2 and each shot area on the wafer 8 becomes approximately zero.

Next, in step SB38, the projection magnification of the projection optical system 7 is adjusted via the imaging characteristics controller 14 of FIG. 1 so as to correct the chip scaling error in the transformation matrix B of equation (11) or equation (12). This means adjusting the projection magnification of the projection optical system 7 to match with the chip scaling $r_x$ and $r_y$ constituting the elements of the transformation matrix B shown by equation (9) or equation (10). As a result, the magnification error for the projection image of the pattern of the reticle 2 and each shot area on the wafer 8 becomes approximately zero.

After this, in step SB40 of FIG. 8, using the transformation matrices A and O which contain the elements consisting of the six error parameters obtained in step SB34, and substituting the design array coordinate values ($C_{Xn}$, $C_{Yn}$) of the reference point 28-n of each shot area 27-n on the wafer 8 in equation (14), the design array coordinate values ($G_{Xn}$, $G_{Yn}$) on the stage coordinate system (X, Y) of the reference points 28-n are obtained.

Then, in step SB42, the reference point 28-n of each shot area 27-n on the wafer 8 is aligned with a prescribed position within the exposure field of the projection optical system 7 of FIG. 1 sequentially, based on the array coordinates ($G_{Xn}$, $G_{Yn}$) obtained by calculation, and the previously obtained base line amount, and the relevant shot areas 27-n is projection exposed with the pattern image of the reticle 2. Then, after exposure to all of the shot areas on the wafer 8 has been completed, the wafer 8 is unloaded, and processing such as development is performed. Projection exposure is performed by respectively transferring patterns of the reticle 2 to the plurality of shot areas using a step-and-repeat method or a step-and-scan method.

In the above, processing of the second wafer of the lot is complete. As described, with respect to this wafer, the number of measurements of the alignment marks provided in the shot region is reduced, enabling an improvement in throughput.

Here with this embodiment, the shot error is considered using the four error parameters ($\theta$, w, $\gamma_x$, $\gamma_y$) within the ten error parameters used in the shot error correction method, which are obtained at the time of processing the first wafer with respect to each shot area, and the wafer error parameters used in the wafer error correction method are corrected.

Consequently, an improvement in throughput is achieved, and since consideration is given not only to the transformation matrices A and O, but also to the transformation matrix B constituting the parameters of the orthogonality error of the chip and the chip scaling, the influence such as expansion and contraction and rotation of the chip pattern itself which is transferred to each shot area can be kept to a minimum. Hence the chip pattern of each shot area on the wafer and the projection image of the patterns of the reticle can be superimposed to a higher accuracy.

With respect to the third and subsequent wafers of the lot, the processing returns to step SB28, and processing the same as for the second wafer of the lot is repeated.

In the abovementioned embodiment, the description is for the case where the processing is started from the first wafer of the lot. However there is no limitation to this, and shot error may be performed with respect to optional wafers of the lot, and with respect to the subsequent wafers, processing shown in steps SB28 through SB42 in FIG. 8 may be performed.

Furthermore, in the processing of step SB32 in FIG. 8, the description is given for the case where one alignment mark is measured for one shot area. However there is no limitation to this, and a plurality of alignment marks may be measured.

For example, in the case where the shot area is a square as shown in FIG. 3B, and the alignment marks are formed at the four corners of the shot area, then preferably two alignment marks on one diagonal are measured.

When detecting a plurality of alignment marks belonging to one shot area, the plurality of coordinate values obtained by detecting the plurality of alignment marks may be averaged and handled as one coordinate value. That is to say, this average value may be used as a coordinate value (measurement value) of the shot area. Alternatively, respective weightings may be performed for a plurality of coordinate values to determine one coordinate value.

In this case, the array coordinate values of the reference point 28-n within the shot area may be obtained based on a plurality of alignment marks to be measured. Therefore alignment to an even higher accuracy may be performed.

Furthermore, in the abovementioned embodiment, alignment is performed using the shot error correction method only with respect to the first waver of the lot. With respect to the second and subsequent wafers, only the six error parameters related to the wafer error are obtained, and the four error parameters ($\theta$, w, $\gamma_x$, $\gamma_y$) related to the shot error use the result obtained for the first wafer. That is to say, alignment is performed using the wafer error correction method. However the shot error correction method may be performed for each of a prescribed number of wafers.

In the abovementioned embodiment, as shown in FIG. 3B, cross shape alignment marks 29-n through 35-n which can be simultaneously aligned with the X direction and the Y direction on the stage coordinate system, are doubly provided on the X-axis, and doubly provided on the Y-axis of the coordinate system of the shot area. However, if for example four alignment marks are not arranged on one straight line, then such an arrangement is not necessary.

Then, as with the first embodiment, the alignment marks shown in FIG. 6 or FIG. 7 may be used as the alignment marks.

Third Embodiment

Next is a description of a third embodiment of the present invention.

In the above described first and second embodiments, correction is performed using both the wafer error correction method and the shot error correction method, in performing alignment.

If the shot error correction method is used, accuracy of alignment is improved, however time is required for measuring alignment.

In this embodiment, a method of improving alignment accuracy using only the wafer error correction method without using the shot error correction method is described.

With the alignment method of this embodiment, position information (coordinate values) of a prescribed number of alignment marks within the plurality of alignment marks formed on each shot area is detected.

For example, in the case where the shot area is a square as shown in FIG. 3B, and the alignment marks are formed at the four corners of the shot area, then two alignment marks on one diagonal are measured.

When detecting a plurality of alignment marks belonging to one alignment shot area, the plurality of coordinate values obtained by detecting the plurality of alignment marks may be averaged and handled as one coordinate value. That is to say, this average value may be used as a coordinate value (measurement value) of the shot area. Alternatively, respective weightings may be performed for a plurality of coordinate values to determine one coordinate value.

Then, using the wafer error correction method (equation (2)), the computation array coordinate values $(G_{Xn}, G_{Yn})$ on the stage coordinate system (X, Y) of each shot area (reference point) on the wafer are obtained. That is to say, the coordinate values for the X direction and the Y direction for each alignment shot area determined for example by the aforementioned averaging processing, are substituted in the aforementioned equation (2), and the six error parameters are calculated using for example the least-squares method. Then, the design array coordinate values $(C_{Xn}, C_{Yn})$ of each shot area 27-n (reference point 28-n) are substituted in equation (2) having the transformation matrices A, O which contain elements comprising these six error parameters, and the computation array coordinate values $(G_{Xn}, G_{Yn})$ of the reference point 28-n thereof are calculated.

Then, the wafer is moved based on these calculated arrangement coordinate values $(G_{Xn}, G_{Yn})$ and the pattern of the reticle 2 is transferred to each shot area on the wafer with a step-and-repeat method, or a step-and-scan method.

With this embodiment, the reference point 28-n is computed based on the measurement results of the plurality of alignment marks with respect to one shot area. Therefore the computation accuracy for the reference point 28-n (array coordinate value) obtained by statistical processing is improved, and accuracy at the time of alignment is improved.

Fourth Embodiment

Next is a description of a fourth embodiment of the present invention. In this embodiment, the wafer error correction method using equation (2) (first EGA mode), the shot error correction method using equation (9) or equation (10) (second EGA mode), and the wafer error correction method explained for the third embodiment (third EGA mode) are stored in a memory of the main control system 6. Furthermore, a wafer error correction method which uses a model function where the number of error parameters is less than in equation (2) (fourth EGA mode) is also stored in the memory. In this embodiment, a model function where it is assumed for example that the error parameters $R_x$, $R_y$ related to wafer scaling are equal, and the error parameter W related to orthogonality is zero, that is a model function stipulated by four error parameters $(\Theta, R (=R_x=R_y), O_X, O_Y)$, is used for the fourth EGA mode. Consequently, in the fourth EGA mode in this example, by selecting two shot areas on the wafer as alignment shot areas, and obtaining two lots of position information (coordinate values in the X direction and Y direction) for each of these alignment shot areas, the four error parameters can be obtained for example by the least-squares method.

In the main control system 6 is stored data related to the arrangement of the alignment shot areas (number and position etc.), and data related to the arrangement of the alignment marks (number and position etc.) for which the coordinate values are to be measured in the alignment shot areas. Therefore, the main control system 6 selects a suitable alignment mode for the wafer which is to be exposure processed, based on these data, and wafer alignment is executed in accordance with the selected mode.

For example, when the number of alignment shot areas is two, the fourth EGA mode is automatically selected. However, when the number of alignment shot areas is two but the coordinate values of the X direction and the Y direction are not obtained for each alignment shot area, the fourth EGA mode cannot be used. On the other hand, even if at least three shot areas are selected as the alignment shot areas, when the alignment shot area for measuring the coordinate values in the X direction and the Y direction becomes two, the fourth EGA mode is selected.

Moreover, when the number of alignment shot areas is at least three, and the number of one dimensional alignment marks to be detected for each alignment shot area is two (that is a group of an X mark and Y mark), or the number of two dimensional alignment marks is one, the first EGA mode is automatically selected. However, when the above conditions are satisfied but the coordinate values in the X direction and the Y direction are not obtained for each alignment shot area, the first EGA mode cannot be used. On the other hand, even if the number (groups) of alignment marks to be detected for each alignment shot area is more than for the abovementioned conditions, when only one group of the coordinate values in the X direction and Y direction is obtained, the first EGA mode is selected.

Furthermore, when the number of alignment shot areas is at least three, and the number of one dimensional alignment marks to be detected for each alignment shot area is four (that is two groups of an X mark and Y mark), or the number of two dimensional alignment marks is two, the third EGA mode is automatically selected. However, when the above conditions are satisfied but the coordinate values in the X direction and the Y direction of the two groups are not obtained for each alignment shot area, the third EGA mode cannot be used. On the other hand, even if the number (groups) of alignment marks to be detected for each alignment shot area is more than for the abovementioned conditions, when only two groups of the coordinate values in the X direction and Y direction are obtained, the third EGA mode is selected.

Moreover, when the number of alignment shot areas is at least three, and the number of one dimensional alignment marks to be detected for each alignment shot area is at least six (that is at least three groups of an X mark and Y mark), or the number of two dimensional alignment marks is at least three, the second EGA mode is automatically selected. However, when the above conditions are satisfied but the coordinate values in the X direction and the Y direction of at least three groups are not obtained for each alignment shot area, the second EGA mode cannot be used.

In the second EGA mode, it is not necessary to obtain at least three coordinate values in the X direction and the Y direction for each of the alignment shot areas, it being sufficient to obtain for one part of at least three alignment shot areas, for example the coordinate values in the X direction and the Y direction of two groups, and the coordinate value for either of the X direction and the Y direction. However, in this case, at least four alignment shot areas are necessary. Furthermore, when the second EGA mode is selected, and a plurality of wafers within the same lot are respectively exposure processed, then instead of the second EGA mode, an alignment mode may be selected which uses in common the wafer error correction method and the shot error correction method respectively described for the aforementioned first and second embodiments.

In this embodiment as mentioned above, the alignment mode is automatically selected based on data and so forth related to the arrangement of the alignment shot area. Therefore, it is possible to improve throughput without a drop in alignment accuracy.

Embodiments of the present invention have been described above. In the above described embodiments, in the case where statistical processing is performed, linear statistical processing is carried out. That is to say, in the case where for example adjacent reference points 28-n are measured, the distance between the reference points 28-n is obtained, and with the reference point 28-n which has been measured as the center, a position for which the distance between the reference points 28-n in the x, y direction is multiplied several times, is made the reference point for the shot areas for which measurement has not been made.

On the other hand, with the reference point 28-n obtained by measurement as the center, a reference point 28-n of shot areas which have been subjected to weighting corresponding to the distance from this center point and for which measurement has not been performed may be obtained, and the reference point 28-n obtained when statistical processing is performed becomes even closer to the design value.

In the above, embodiments of the present invention have been described. However the present invention is not limited to the above described embodiments, and may be freely modified within the scope of the present invention.

Incidentally, in the aforementioned wafer error correction method a model function which contains six error parameters is used, and in the shot error correction method a model function which contains ten error parameters is used. However the number of error parameters used in the aforementioned respective embodiments is not limited to these, and the number thereof may be set corresponding for example to the required alignment accuracy and so forth. Furthermore, the number of alignment shot areas and the number of alignment marks formed in the shot areas (the number of position information to be obtained for each alignment shot area) is determined pursuant to the type and number of the aforementioned error parameters. Moreover, the value of the error parameter is obtained in each of the aforementioned embodiments. However instead of this error parameter, each element (parameter) of the transformation matrix of equation (2), equation (9) or equation (10) may be obtained. Furthermore, in the calculation of the error parameters (or each element of the transformation matrix), the least-squares method was used, however statistical processing other than this may be used.

A detailed description of the wafer error correction method is disclosed for example in Japanese Unexamined Patent Application, First Publication No. 61-44429, and the corresponding U.S. Pat. No. 4,780,617, and within the permissible limits of the domestic laws of the designated countries appointed by this International Patent Application, or the elected countries which have been selected, the disclosure of the abovementioned Japanese patent publication and U.S. patent is cited as a part of the disclosure of this specification. Furthermore, the wafer error correction method, as disclosed for example in Japanese Unexamined Patent Application, First Publication No. 5-304077, and the corresponding U.S. Pat. No. 5,525,808, which applies respective weightings to the coordinate values of the alignment shot areas (or the aforementioned sum of squares of the alignment errors) to obtain the error parameters may be used, and within the permissible limits of the domestic laws of the designated countries appointed by this International Patent Application, or the elected countries which have been selected, the disclosure of the abovementioned Japanese patent publication and U.S. patent is cited as a part of the disclosure of this specification.

Moreover, the exposure apparatus to which the present invention is applied is not limited to one used in semiconductor device manufacture, and for example the present invention may be applied to an exposure apparatus for manufacturing display devices including for example liquid crystal elements or plasma displays, micro devices (electron devices) such as thin film magnetic heads and imaging elements (CCD), or masks or reticles. Furthermore, for the exposure apparatus, any of the step-and-repeat method, the step-and-scan method, and the step-and-stitch method are suitable, and the exposure illumination light also is not limited to ultraviolet radiation or far-ultraviolet light, and charged particle beams such as vacuum-ultraviolet light ($F_2$ laser light, $Ar_2$ laser light etc.), a laser plasma light source, or soft X-rays generated from a SOR, that is EUV (Extreme Ultra Violet) radiation, electron beams or iron beams, or soft X-rays etc. is suitable. Moreover, the present invention may be applied not only to exposure apparatus but also for example to detection apparatus and laser repair apparatus.

Furthermore, the exposure apparatus of FIG. 1 is not limited to a static exposure method for exposing the wafer with exposure illumination light via the reticle, with the reticle and the wafer in a substantially static condition, and as disclosed for example in Japanese Unexamined Patent Application, First Publication No. 4-196513 and the corresponding U.S. Pat. No. 5,473,410, this may be a scanning exposure method where the wafer is moved relatively with respect to the exposure illumination light, in synchronism with the reticle being moved relatively with respect to the exposure illumination light, and within the permissible limits of the domestic laws of the designated countries appointed by this International Patent Application, or the elected countries which have been selected, the disclosure of the abovementioned Japanese patent publication and U.S. patent is cited as a part of the disclosure of this specification. Furthermore, the alignment system 15 is not limited to the off axis method, and may be either one or a through-the-lens (TTL) type where the alignment mark on the wafer is detected via the projection optical system 7, or a through-the-reticle (TTR) type where the alignment mark on the wafer is detected via the reticle 2 and the projection optical system 7.

Moreover, a semiconductor device is fabricated for example through a step for designing the functions and performance of the device, a step for producing a reticle based on this design step, a step for producing a wafer from a silicon material, a step for transferring the pattern of the reticle onto the wafer in accordance with the flow chart of FIG. 5 and FIG. 8, a step for assembling the device (including a dicing step, a bonding step, and a packaging step) and an inspection step.

All of the disclosure contents of Japanese Patent Application No. 10-294479 filed on Sep. 30, 1998 including the specification, claims, drawings and abstract, is included in its entirety in this application.

I claim:

1. An alignment method for determining for each of N ($N \geq 2$) substrates, exposure position information for a plurality of areas on said substrates to which a pattern of a mask is transferred, comprising the steps of:

detecting a plurality of marks formed on an nTH substrate ($1 \leq n \leq N-1$), and in order to determine exposure position information for a plurality of areas on said nTH substrate using a first model function, determining a first parameter, which relates to array of said plurality of areas on said substrate, and a second parameter, which relates to an error of an image formation relationship relative to said pattern of said mask in said area, of said first model function using position information of said detected marks, and detecting a plurality of marks formed on an (n+k)TH substrate ($1 \leq k \leq N-n$), and in order to determined exposure position information for a plurality of areas on said (n+k)TH substrate using said first model function, determining said first parameter using a second model function different from said first model function, and position information of marks detected on said (n+k)TH substrate, and using this together with the second parameter determined for said nTH substrate.

2. An alignment method according to claim 1, wherein said second model function has a number of parameters less than that of said first model function.

3. An alignment method according to claim 2, wherein said second model function contains at least said first parameter.

4. An alignment method according to claim 3, wherein said first parameter shows array information for said plurality of areas.

5. An alignment method according to claim 4, wherein said first parameter contains at least two parameters related to scaling, rotation error, orthogonality, or offset of said substrate.

6. An alignment method according to claim 5, wherein said second parameter shows formation information for an area on said substrate.

7. An alignment method according to claim 6, wherein said second parameter contains at least two parameters related to scaling, rotation error, or orthogonality of said area.

8. An alignment method according to claim 1, wherein a plurality of marks in each of at least three specific areas selected from said plurality of areas is detected for said nTH substrate.

9. An alignment method according to claim 1, wherein at least one mark for each of at least two specific areas selected from said plurality of areas is detected for said (n+k)TH substrate.

10. An alignment method according to claim 9, wherein a plurality of marks in said specific area are detected for said (n+k)TH substrate, and one position information of said specific area is determined from position information of said plurality of marks.

11. An alignment method according to claim 1, wherein the total of the marks detected for said (n+k)TH substrate is less than the total of the marks detected for said nth substrate.

12. An alignment method according to claim 11, wherein for said nTH substrate, determining of the first and second parameters of said first model function, and determining of said first parameter using said second model function, is performed based on position information of said detected mark, and the first parameter determined by said second model function is used instead of the first parameter determined by said first model function.

13. An alignment method according to claim 1, wherein said second model function contains only said first parameter, and a deviation between respective set positions and measurement positions in the plurality of specific areas on said substrate where said marks are detected is obtained, and said first parameter is determined so that the sum total of the square of said deviation is a minimum.

14. An alignment method according to claim 1, wherein said nTH substrate is the first substrate, and said (n+K)TH substrate is the second substrate.

15. An alignment method according to claim 1, wherein said (n+k)TH substrate is the third and subsequent substrates, and at the time of determining said exposure position information, at least one of said second parameters respectively determined up to the (n+k−1)TH substrate is used.

16. An alignment method according to claim 1, wherein said nTH substrate is at least the first substrate of said N substrates.

17. An alignment method according to claim 1, wherein said nTH substrate is at least two substrates among said N substrates which are not consecutive from each other.

18. An exposure method for carrying out an exposure operation using the alignment method according to claim 1, wherein said mask and said substrate are relativity moved based on said determined exposure position information, and a pattern of said mask is respectively transferred to said plurality of areas by a step-and-repeat method or a step-and-scan method.

19. A device manufacturing method comprising the step of: transferring a device pattern onto a substrate using the exposure method of claim 18.

20. An alignment apparatus which determines for each N ($N \geq 2$) substrates, exposure position information for a plurality of areas on said substrates to which a pattern of a mask is transferred, comprising:

a detector which detects a plurality of marks formed on one of the plurality of substrates;

a first controller which is electrically connected to said detector and which controls the detector to detect a plurality of marks formed on an nTH substrate ($1 \leq n \leq N-1$), and the first controller in order to determine exposure position information for a plurality of areas on said nTH substrate using a first model function, determines a first parameter and a second parameter of said first model function using position information of said detected marks, the first parameter relates to array of said plurality of areas on said substrate, the second parameter relates to an error of an image formation relationship relative to said pattern of said mask in said area; and a second controller which is electrically connected to said detector and said first controller and which controls the detector to detect a plurality of marks formed on an (n+k)TH substrate ($1 \leq k \leq N-n$), and the second controller in order to determine exposure position information for a plurality of areas on said (n+k)TH substrate using said first model function, determines said first parameter using a second model function different from said first mode function, and position information of said marks detected on said (n+k)TH substrate, and uses this determined first parameter together with the second parameter determined for said nTH substrate.

21. An alignment apparatus according to claim 20, wherein said second model function has a number of parameters less than that of said first model function.

22. An alignment apparatus according to claim 20, wherein said first parameter shows array information for said plurality of areas.

23. An alignment apparatus according to claim 22 wherein said first parameter contains at least two parameters related to scaling, rotation error, orthogonality, or offset of said substrate.

24. An alignment apparatus according to claim 20 wherein said second parameter shows formation information for an area on said substrate.

25. An alignment apparatus according to claim 24, wherein said second parameter contains at least two parameters related to scaling, rotation error, or orthogonality of said area.

26. An alignment apparatus according to claim 20, wherein said nTH substrate is the first substrate, and said (n+k)TH substrate is the second substrate.

27. An alignment apparatus according to claim 20, wherein said (n+k)TH substrate is the third and subsequent substrates, and at the time of determining said exposure position information, at least one of said second parameters respectively determined up to the (n−k−1)TH substrate is used.

28. An exposure apparatus which carries out an exposure operation using the alignment apparatus according to claim 20, wherein said mask and said substrate are relativity moved based on said determined exposure position information, and a pattern of said mask is respectively transferred to said plurality of areas by a step-and-repeat method or a step-and-scan method.

* * * * *